(12) United States Patent
Danilov et al.

(10) Patent No.: US 11,735,282 B2
(45) Date of Patent: Aug. 22, 2023

(54) TEST DATA VERIFICATION FOR AN ORDERED EVENT STREAM STORAGE SYSTEM

(71) Applicant: EMC IP Holding Company LLC, Hopkinton, MA (US)

(72) Inventors: Mikhail Danilov, Saint Petersburg (RU); Andrei Paduroiu, Bellevue, WA (US); Maksim Vazhenin, Saint Petersburg (RU)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

(21) Appl. No.: 17/383,425

(22) Filed: Jul. 22, 2021

(65) Prior Publication Data
US 2023/0023644 A1    Jan. 26, 2023

(51) Int. Cl.
*G11C 29/10* (2006.01)
(52) U.S. Cl.
CPC .................................. *G11C 29/10* (2013.01)
(58) Field of Classification Search
None
See application file for complete search history.

(56) References Cited

U.S. PATENT DOCUMENTS

| 3,617,587 A | 11/1971 | Nayar et al. |
| 5,826,977 A | 10/1998 | Fowler et al. |
| 7,340,690 B2 | 3/2008 | Lau |
| 7,430,570 B1 | 9/2008 | Srinivasan et al. |
| 7,610,437 B2 | 10/2009 | Sinclair et al. |

(Continued)

FOREIGN PATENT DOCUMENTS

| CA | 2 534 170 A1 | 7/2007 |
| CA | 2672879 | 4/2008 |

(Continued)

OTHER PUBLICATIONS

Phaujdar, "Understanding Event Streams—A Comprehensive Guide 101_ Learn Hevo"(Feb. 17, 2021) (Year: 2021).*

(Continued)

*Primary Examiner* — Cynthia Britt
*Assistant Examiner* — Matthew W Wahlin
(74) *Attorney, Agent, or Firm* — Amin, Turocy & Watson, LLP

(57) ABSTRACT

Data verification technology for ordered event stream (OES) events written into an ordered event stream storage system is disclosed. The verification technology provides perfect reliability. The verification technology further requires low storage overhead in comparison to typical checksums, storing replicated data, etc. Test event data can be generated in a reproducible manner based upon determined OES metadata. OES metadata can be determined from input received via a user interface, via characteristics of an OES storage system, etc., and can be stored for later use in data verification. The test event data can be stored to a portion of an OES storage system under test. The stored test event data can subsequently be verified by using the stored OES metadata to regenerate test event data for comparison to the stored test event data. The test event ordering can be verified via sequence information included in the stored test event data.

20 Claims, 10 Drawing Sheets

(56) References Cited

U.S. PATENT DOCUMENTS

| | | |
|---|---|---|
| 7,769,717 B2 | 8/2010 | Federwisch et al. |
| 7,984,084 B2 | 7/2011 | Sinclair |
| 8,285,918 B2 | 10/2012 | Maheshwari |
| 8,443,263 B2 | 5/2013 | Selinger et al. |
| 8,572,091 B1 | 10/2013 | Sivasubramanian et al. |
| 8,655,825 B2 | 2/2014 | Roesch et al. |
| 8,732,403 B1 | 5/2014 | Nayak |
| 8,825,848 B1 | 9/2014 | Dotan et al. |
| 8,873,284 B2 | 10/2014 | Sinclair et al. |
| 8,984,248 B2 | 3/2015 | Morishita et al. |
| 9,223,693 B2 | 12/2015 | Sinclair et al. |
| 9,336,133 B2 | 5/2016 | Sinclair et al. |
| 9,348,746 B2 | 5/2016 | Sinclair et al. |
| 9,407,521 B1 | 8/2016 | Kulkarni |
| 9,465,731 B2 | 10/2016 | Sinclair et al. |
| 9,514,018 B2 | 12/2016 | Sikri |
| 9,591,316 B2 | 3/2017 | Bracha et al. |
| 9,639,589 B1 | 5/2017 | Theimer |
| 9,715,434 B1 | 7/2017 | Xu et al. |
| 9,734,050 B2 | 8/2017 | Sinclair et al. |
| 9,734,911 B2 | 8/2017 | Sinclair et al. |
| 9,753,932 B1 | 9/2017 | Brow et al. |
| 9,778,855 B2 | 10/2017 | Sinclair |
| 9,892,803 B2 | 2/2018 | Reed |
| 9,898,482 B1 | 2/2018 | Bono |
| 9,965,215 B1 | 5/2018 | Vazhenin et al. |
| 10,108,543 B1 | 10/2018 | Duggal et al. |
| 10,108,544 B1 | 10/2018 | Duggal et al. |
| 10,120,613 B2 | 11/2018 | Sinclair et al. |
| 10,133,490 B2 | 11/2018 | Sinclair et al. |
| 10,255,179 B2 | 4/2019 | Ji et al. |
| 10,338,834 B1 | 7/2019 | Dighe et al. |
| 10,430,279 B1 | 10/2019 | Dittia et al. |
| 10,565,208 B2 | 2/2020 | Triou, Jr. et al. |
| 10,628,424 B2 | 4/2020 | Park et al. |
| 10,705,741 B1 | 7/2020 | Varadarajan et al. |
| 10,795,812 B1 | 10/2020 | Duggal et al. |
| 10,860,457 B1 | 12/2020 | Evenson |
| 10,867,033 B2 | 12/2020 | Keren et al. |
| 10,891,228 B2 | 1/2021 | Burow |
| 10,983,715 B2 | 4/2021 | Sharoni et al. |
| 11,016,826 B2 | 5/2021 | Ehmann |
| 11,086,537 B2 | 8/2021 | Byun |
| 11,194,638 B1 | 12/2021 | Danilov et al. |
| 11,314,779 B1 | 4/2022 | Jain |
| 11,354,054 B2 | 6/2022 | Danilov et al. |
| 2004/0199524 A1 | 10/2004 | Rys et al. |
| 2005/0025152 A1 | 2/2005 | Georgiou et al. |
| 2005/0055519 A1 | 3/2005 | Stuart et al. |
| 2006/0036568 A1 | 2/2006 | Moore et al. |
| 2006/0058987 A1 | 3/2006 | Kumar et al. |
| 2007/0033325 A1 | 2/2007 | Sinclair et al. |
| 2007/0047635 A1 | 3/2007 | Stojanovic et al. |
| 2007/0220518 A1 | 9/2007 | Verbowski et al. |
| 2008/0059724 A1 | 3/2008 | Stifter, Jr. |
| 2008/0082596 A1 | 4/2008 | Gorobets |
| 2008/0144079 A1 | 6/2008 | Pandey et al. |
| 2008/0184262 A1 | 7/2008 | Ginis et al. |
| 2008/0189477 A1 | 8/2008 | Asano et al. |
| 2008/0288713 A1 | 11/2008 | Lee et al. |
| 2008/0301135 A1 | 12/2008 | Alves et al. |
| 2009/0182784 A1 | 7/2009 | Rohit et al. |
| 2010/0077013 A1 | 3/2010 | Clements et al. |
| 2010/0083098 A1 | 4/2010 | Leme et al. |
| 2010/0088296 A1 | 4/2010 | Periyagaram et al. |
| 2010/0125553 A1 | 5/2010 | Huang et al. |
| 2010/0125794 A1 | 5/2010 | Hampton et al. |
| 2010/0174881 A1 | 7/2010 | Anglin et al. |
| 2010/0205163 A1 | 8/2010 | Eshghi et al. |
| 2010/0281081 A1 | 11/2010 | Stager et al. |
| 2010/0333116 A1 | 12/2010 | Prahlad et al. |
| 2011/0126099 A1 | 5/2011 | Anderson et al. |
| 2011/0131588 A1 | 6/2011 | Allam et al. |
| 2011/0145473 A1 | 6/2011 | Maheshwari |
| 2011/0161784 A1 | 6/2011 | Selinger et al. |
| 2011/0249147 A1 | 10/2011 | Ishii |
| 2012/0102503 A1 | 4/2012 | Meijer et al. |
| 2012/0109985 A1 | 5/2012 | Chandrasekaran |
| 2012/0151014 A1 | 6/2012 | Gokhale et al. |
| 2012/0198027 A1 | 8/2012 | Tetzler et al. |
| 2012/0259994 A1 | 10/2012 | Gillies et al. |
| 2013/0226931 A1 | 8/2013 | Tazel et al. |
| 2013/0275808 A1 | 10/2013 | McNeeney et al. |
| 2014/0006465 A1 | 1/2014 | Davis et al. |
| 2014/0089264 A1 | 3/2014 | Talagala et al. |
| 2014/0223115 A1 | 8/2014 | Dinkjian et al. |
| 2014/0325148 A1 | 10/2014 | Choi et al. |
| 2014/0365719 A1 | 12/2014 | Kuzmin et al. |
| 2015/0169449 A1 | 6/2015 | Barrell et al. |
| 2015/0172120 A1 | 6/2015 | Dwarampudi et al. |
| 2015/0205816 A1 | 7/2015 | Periyagaram et al. |
| 2015/0227602 A1 | 8/2015 | Ramu et al. |
| 2015/0261776 A1 | 9/2015 | Attarde et al. |
| 2015/0341212 A1 | 11/2015 | Hsiao et al. |
| 2015/0355862 A1 | 12/2015 | Hayes et al. |
| 2015/0363245 A1 | 12/2015 | Mutschler |
| 2016/0042008 A1 | 2/2016 | Tripathy et al. |
| 2016/0063080 A1 | 3/2016 | Nano et al. |
| 2016/0210061 A1 | 7/2016 | Soncodi et al. |
| 2016/0246713 A1 | 8/2016 | Choi et al. |
| 2016/0321287 A1 | 11/2016 | Uthra et al. |
| 2016/0337435 A1 | 11/2016 | Nigam et al. |
| 2016/0350324 A1 | 12/2016 | Wang et al. |
| 2016/0357476 A1 | 12/2016 | Chen et al. |
| 2017/0038978 A1 | 2/2017 | Li et al. |
| 2017/0075832 A1 | 3/2017 | Bhimani et al. |
| 2017/0075947 A1 | 3/2017 | Kurilov et al. |
| 2017/0123655 A1 | 5/2017 | Sinclair et al. |
| 2017/0177249 A1* | 6/2017 | Kurilov .............. G06F 11/0793 |
| 2017/0177263 A1 | 6/2017 | Das et al. |
| 2017/0177546 A1 | 6/2017 | Heinz et al. |
| 2017/0212891 A1 | 7/2017 | Pundir et al. |
| 2017/0213127 A1 | 7/2017 | Duncan |
| 2017/0255392 A1 | 9/2017 | Nakashima |
| 2017/0289214 A1 | 10/2017 | Cho et al. |
| 2018/0101842 A1 | 4/2018 | Ventura et al. |
| 2018/0121307 A1 | 5/2018 | Braun et al. |
| 2018/0146018 A1 | 5/2018 | Chang et al. |
| 2018/0176244 A1 | 6/2018 | Gervais et al. |
| 2018/0184138 A1 | 6/2018 | Shaw et al. |
| 2018/0189175 A1 | 7/2018 | Ji et al. |
| 2018/0314727 A1 | 11/2018 | Epstein et al. |
| 2018/0329644 A1 | 11/2018 | Das et al. |
| 2018/0332325 A1 | 11/2018 | Kaitchuck |
| 2018/0332365 A1 | 11/2018 | Kaitchuck et al. |
| 2018/0332366 A1 | 11/2018 | Paduroiu |
| 2018/0332367 A1 | 11/2018 | Kaitchuck et al. |
| 2018/0336256 A1 | 11/2018 | Li et al. |
| 2018/0345140 A1 | 12/2018 | Posin |
| 2019/0004863 A1 | 1/2019 | Mainali et al. |
| 2019/0026301 A1 | 1/2019 | Wang et al. |
| 2019/0057138 A1 | 2/2019 | Knowles et al. |
| 2019/0129806 A1 | 5/2019 | Hsu et al. |
| 2019/0138494 A1 | 5/2019 | Inoue |
| 2019/0197173 A1 | 6/2019 | Tahara et al. |
| 2019/0278849 A1 | 9/2019 | Chandramouli et al. |
| 2019/0327297 A1 | 10/2019 | Madani |
| 2019/0332318 A1 | 10/2019 | Gooding et al. |
| 2019/0340180 A1 | 11/2019 | Barsness et al. |
| 2019/0349422 A1 | 11/2019 | Dhruvakumar et al. |
| 2020/0034468 A1 | 1/2020 | Lei et al. |
| 2020/0089420 A1 | 3/2020 | Sharoni et al. |
| 2020/0174695 A1 | 6/2020 | Bazarsky et al. |
| 2020/0250172 A1 | 8/2020 | Busjaeger et al. |
| 2020/0310686 A1 | 10/2020 | Truong et al. |
| 2020/0320005 A1 | 10/2020 | Shulman et al. |
| 2020/0344299 A1 | 10/2020 | Sohail et al. |
| 2020/0394196 A1 | 12/2020 | Shivanna et al. |
| 2020/0404011 A1 | 12/2020 | Gervais et al. |
| 2021/0110328 A1 | 4/2021 | Hsiao et al. |
| 2021/0124746 A1 | 4/2021 | Klaedtke |
| 2021/0157520 A1 | 5/2021 | Bavishi et al. |
| 2021/0256029 A1 | 8/2021 | Danilov et al. |
| 2021/0342296 A1 | 11/2021 | Danilov et al. |

(56) References Cited

U.S. PATENT DOCUMENTS

| | | | |
|---|---|---|---|
| 2021/0342354 | A1 | 11/2021 | Danilov et al. |
| 2021/0365211 | A1 | 11/2021 | Danilov et al. |
| 2021/0374021 | A1 | 12/2021 | Santhakumar et al. |
| 2022/0035533 | A1 | 2/2022 | Danilov et al. |
| 2022/0182724 | A1 | 6/2022 | Gupta et al. |

FOREIGN PATENT DOCUMENTS

| | | |
|---|---|---|
| CN | 1708029 | 12/2005 |
| CN | 104901958 | 9/2015 |
| CN | 105591926 | 5/2016 |
| GB | 2377038 | 12/2002 |
| WO | 2002101585 | 12/2002 |
| WO | 2004/080067 A1 | 9/2004 |
| WO | 2009014993 | 1/2009 |
| WO | 2015/196281 A1 | 12/2015 |
| WO | 2015191120 | 12/2015 |
| WO | 2018148149 | 8/2018 |

OTHER PUBLICATIONS

Dhanushka, "Understanding Kafka Topic Partitions"—(Mar. 28, 2021) (Year: 2021).*

Splunk,"Comparing Pulsar and Kafka"—(Dec. 5, 2017) (Year: 2017).*

Akidau et al., "MillWheel: Fault-Tolerant Stream Processing at Internet Scale" Proceedings of the VLDB Endowment, vol. 6, No. 11, 2013, 12 pages.

Akidau et al., "The Dataflow Model: A Practical Approach to Balancing Correctness, Latency, and Cost in Massive-Scale, Unbounded, Out-of-Order Data Processing" Proceedings of the VLDB Endowment, vol. 8, No. 12, 2015, 12 pages.

"Execution Model" [https://beam.apache.org/documentation/runtime/model/]. The Apache Software Foundation. Retrieved Aug. 26, 2020, 5 pages.

"Apache Beam Programming Guide" [https://beam.apache.org/documentation/programming-guide/]. The Apache Software Foundation. Retrieved Aug. 26, 2020, 69 pages.

"What is Apache Flink?—Applications" [https://flink.apache.org/flink-applications.html#building-blocks-for-streaming-applications]. The Apache Software Foundation. Copyright 2014-2019, retrieved Aug. 26, 2020, 7 pages.

"What is Apache Flink?—Architecture" [https://flink.apache.org/flink-architecture.html]. The Apache Software Foundation. Copyright 2014-2019, retrieved Aug. 26, 2020, 3 pages.

"Stateful Function—Event-driven Application on Apache Flink" [https://flink.apache.org/stateful-functions.html]. The Apache Software Foundation. Copyright 2014-2019, retrieved Aug. 26, 2020, 8 pages.

"What is Apache Flink?—Operations" [https://flink.apache.org/flink-operations.html]. The Apache Software Foundation. Copyright 2014-2019, retrieved Aug. 26, 2020, 3 pages.

"Use Cases" [https://flink.apache.org/usecases.html]. The Apache Software Foundation. Copyright 2014-2019, retrieved Aug. 26, 2020, 5 pages.

"Introduction" [http://kafka.apache.org/intro]. The Apache Software Foundation. Copyright 2017, retrieved Aug. 26, 2020, 6 pages.

"Apache Kafka Quickstart" [http://kafka.apache.org/quickstart]. The Apache Software Foundation. Copyright 2017, retrieved Aug. 26, 2020, 6 pages.

"Use Cases" [http://kafka.apache.org/uses]. The Apache Software Foundation. Retrieved Aug. 26, 2020, 3 pages.

"Architecture Overview" [pulsar.apache.org/docs/en/concepts-architecture-overview/]. The Apache Software Foundation. Copyright 2020, retrieved Aug. 26, 2020, 11 pages.

"Messaging" [pulsar.apache.org/docs/en/concepts-messaging/]. The Apache Software Foundation. Copyright 2020, retrieved Aug. 26, 2020, 32 pages.

"Pulsar Overview" [pulsar.apache.org/docs/en/concepts-overview/]. The Apache Software Foundation. Copyright 2020, retrieved Aug. 26, 2020, 2 pages.

Office Action dated Jan. 29, 2021 for U.S. Appl. No. 16/256,083, 42 pages.

Notice of Allowance dated Jun. 28, 2021 for U.S. Appl. No. 16/884,647, 39 pages.

Office Action dated Jun. 29, 2021 for U.S. Appl. No. 16/881,556, 24 pages.

Notice of Allowance dated Aug. 4, 2021 for U.S. Appl. No. 17/200,652, 51 pages.

Office Action dated Oct. 1, 2021 for U.S. Appl. No. 16/915,762, 57 pages.

Notice of Allowance dated Dec. 15, 2021 for U.S. Appl. No. 17/064,747, 54 pages.

Office Action dated Nov. 10, 2021 for U.S. Appl. No. 16/944,089, 75 pages.

Kleppmann, Martin. "Making Sense of Stream Processing—The Philosophy Behind Apache Kafka and Scalable Stream Data Platforms"; Mar. 4, 2016; retrieved from [https://hashingit.com/elements/research-resources/2016-03-04-making-sense-of-stream-processing.pdf] on Nov. 5, 2021, (Year: 2016), 183 pages.

Notice of Allowance dated Feb. 4, 2022 for U.S. Appl. No. 16/915,762, 57 pages.

Office Action dated Oct. 1, 2021 for U.S. Appl. No. 17/127,724, 41 pages.

Office Action dated Jan. 21, 2022 for U.S. Appl. No. 16/864,892, 26 pages.

Notice of Allowance dated Feb. 24, 2022 for U.S. Appl. No. 17/038,079, 55pgs.

Azhar et al., ""Efficient selection of access control systems through multi criteria analytical hierarchy process"", IEEE, doi: 10.1109/ICET.2012.6375419, 2012, pp. 1-8. (Year: 2012).

Rox et al., ""Construction and Deconstruction of Hierarchical Event Streams with Multiple Hierarchical Layers"", IEEE, doi: 10.1109/ECRTS.2008.13, 2008, pp. 201-210. (Year: 2008).

Notice of Allowance dated Feb. 18, 2022 for U.S. Appl. No. 17/083,145, 70pgs.

Office Action dated Mar. 21, 2022 for U.S. Appl. No. 16/864,905, 125 pgs.

Muskardin et al., "Implementation of Hashing Algorithms in Stream Mining", International Conference on Smart Systems and Technologies (SST), Oct. 2018 , pp. 233-238.

Notice of Allowance dated Apr. 11, 2022 for U.S. Appl. No. 16/944,089, 87 pages.

J. C. Lee, J. Vance and R. Lysecky, "Hardware-Based Event Stream Ordering for System-Level Observation ramework," in IEEE Embedded Systems Letters, vol. 6, No. 4, pp. 81-84, Dec. 2014, doi: 10.1109/LES.2014.2359154. (Year: 2014).

T. Onishi, J. Michaelis and Y. Kanemasa, "Recovery-Conscious Adaptive Watermark Generation for Time-Order Event Stream Processing," 2020 IEEE/ACM Fifth International Conference on Internet-of-Things Design and Implementation (IoTDI), 2020, pp. 66-78, doi: 10.1109/IoTDI49375.2020.00014. (Year: 2020).

Aloysius K. Mok, Honguk Woo and Chan-Gun Lee, "Probabilistic Timing Join over Uncertain Event Streams," 12th IEEE International Conference on Embedded and Real-Time Computing Systems and Applications (RTCSA'06), 2006, pp. 17-26, doi: 10.1109/RTCSA.2006.52. (Year: 2006).

M. Liu, M. Li, D. Golovnya, E. A. Rundensteiner and K. Claypool, "Sequence Pattern Query Processing over Out-of-Order Event Streams," 2009 IEEE 25th International Conference on Data Engineering, 2009, pp. 784-795, doi: 10.1109/ICDE.2009.95. (Year: 2009).

Office Action dated Apr. 20, 2022 for U.S. Appl. No. 16/944,094, 48 pages.

Office Action dated Apr. 12, 2022 for U.S. Appl. No. 17/038,102, 48 pages.

Notice of Allowance dated Apr. 27, 2022 for U.S. Appl. No. 17/127,724, 19 pages.

Office Action dated May 24, 2022 for U.S. Appl. No. 17/237,535, 62 pages.

Office Action dated Jul. 8, 2022 for U.S. Appl. No. 16/864,892, 33 pages.

(56) References Cited

OTHER PUBLICATIONS

Office Action dated Jul. 15, 2022 for U.S. Appl. No. 16/864,905, 77 pages.
Office Action dated Sep. 1, 2022 for U.S. Appl. No. 16/944,094, 25 pages.
Office Action dated Jul. 21, 2022 for U.S. Appl. No. 17/070,029, 68 pages.
Notice of Allowance dated Aug. 24, 2022 for U.S. Appl. No. 17/152,544, 55 pages.
Office Action dated Sep. 30, 2022 for U.S. Appl. No. 17/408,344, 66 pages.
Non-Final Office Action received for U.S. Appl. No. 17/063,906, dated Oct. 27, 2022, 59 pages.
Notice of Allowance received for U.S. Appl. No. 16/864,905, dated Nov. 30, 2022, 347 pages.
Tony Tung et al., "Topology Dictionary for 3D Video Understanding", IEEE Transactions on Pattern Analysis and Machine Intelligence ( vol. 34, Issue: 8, Aug. 2012), Dec. 2011, pp. 1645-1657.
A. Bulut et al., "Distributed data streams indexing using content-based routing paradigm", 19th IEEE International Parallel and Distributed Processing Symposium, Apr. 2005, pp. 1-10.
Notice of Allowance received for U.S. Appl. No. 17/070,029, dated Dec. 2, 2022, 36 pages.
Non-Final Office Action received for U.S. Appl. No. 17/223,263, dated Nov. 28, 2022, 64 pages.
Non-Final Office Action received for U.S. Appl. No. 17/152,558, dated Dec. 7, 2022, 59 pages.
Non-Final Office Action received for U.S. Appl. No. 17/337,940, dated Dec. 30, 2022, 68 pages.
Notice of Allowance dated Nov. 15, 2022 for U.S. Appl. No. 16/864,892, 48 pages.
Notice of Allowance dated Nov. 23, 2022 for U.S. Appl. No. 17/408,344, 35 pages.
Notice of Allowance dated Nov. 17, 2022 for U.S. Appl. No. 16/944,094, 23 pages.
Notice of Allowance received for U.S. Appl. No. 17/063,906, dated Feb. 6, 2023, 29 pages.
Office Action dated Feb. 10, 2023 for U.S. Appl. No. 17/145,588, 78 pages.
Non Final Office Action received for U.S. Appl. No. 17/976,574 dated Mar. 2, 2023, 55 pages.
Notice of Allowance received for U.S. Appl. No. 17/337,940 dated Mar. 1, 2023, 70 pages.
Notice of Allowance received for U.S. Appl. No. 17/223,263, dated Apr. 6, 2023, 32 pages.

\* cited by examiner

TEST DATA VERIFICATION FOR AN ORDERED EVENT STREAM STORAGE SYSTEM

TECHNICAL FIELD

The disclosed subject matter relates to data storage and, more particularly, to test data verification in an ordered event stream (OES) storage system.

BACKGROUND

Conventional data storage techniques can employ an event stream, e.g., storing data corresponding to stream events in a logical order. In a conventional system, an event stream can provide for storing a generally unbounded stream of events whereby a portion of the stored events can then be read out in the order they were stored. One use of data storage is in bulk data storage.

DETAILED DESCRIPTION

Figure 1:
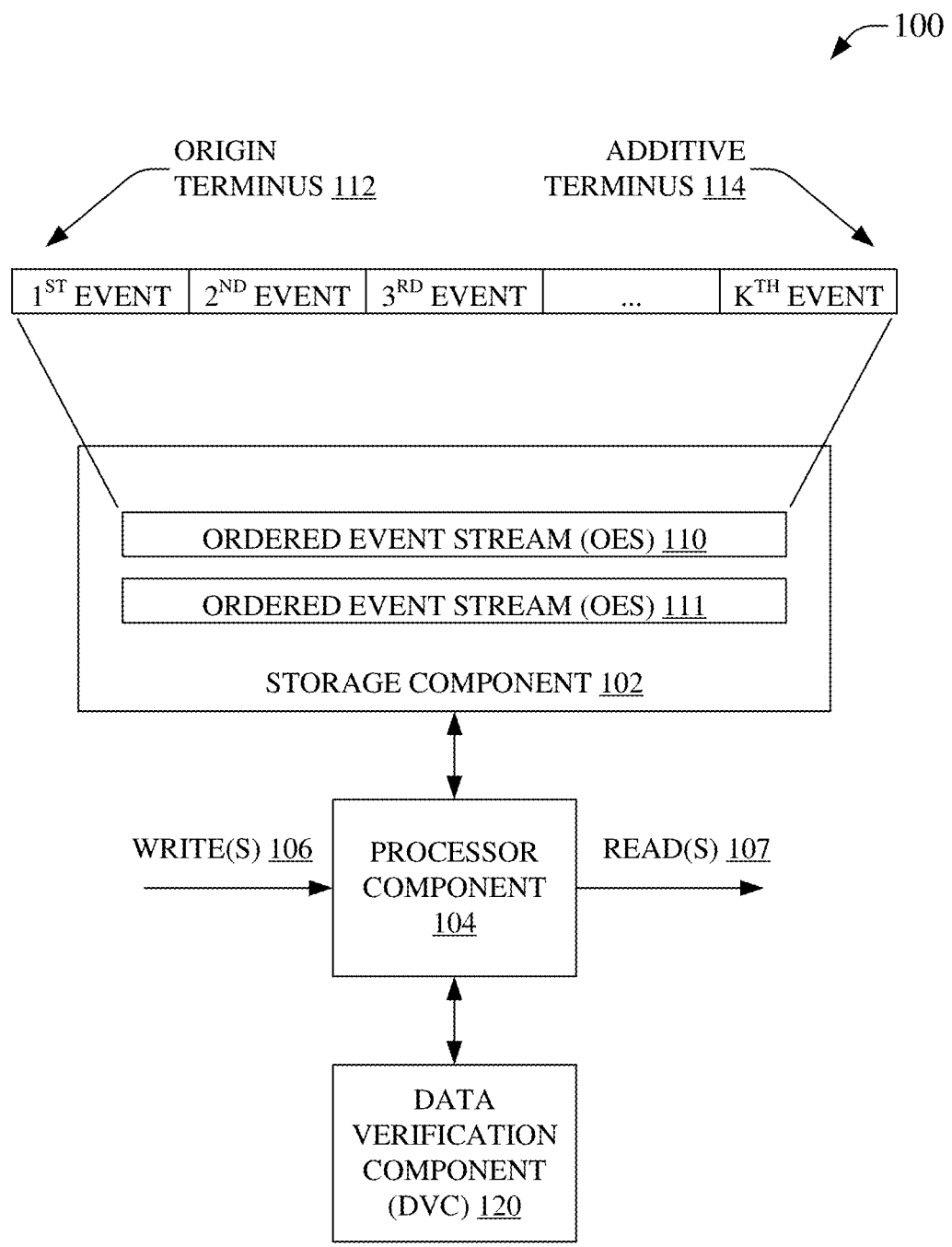
FIG. 1 is an illustration of an example system that can facilitate verification of test data in an ordered event stream storage system, in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

In general, an ordered event stream (OES), or a 'stream' for convenience, can be a durable, elastic, append-only, unbounded sequence of events. An event can be added to a head of a stream of events, e.g., a first event can be considered at a tail of an event stream and a most recent event can be regarded as being at the head of the stream with other events ordered between the tail and the head of the stream. The events need not be, although they can be, stored in contiguous storage locations to be logically sequenced in the stream representation of physical storage, e.g., it is entirely feasible that a first event can be stored on a first disk, a second event on a remotely located second disk, and a third event stored at a further remote third disk, the stream can logically sequence the first, second, and third events by reading the stored data from the different physical locations, the OES can be regarded as an abstraction of physical storage that can store the events in an ordered manner, etc. It is noted that some stream systems can employ an alternate head/tail terminology, for example, a first event can be added at a 'head' of an OES, while subsequent new events can then be added to a 'tail' of the OES, however, this is indistinguishable in all other aspects from the head/tail convention generally employed throughout the instant disclosure. Every event of a stream can be associated with a routing key, or simply a 'key' for convenience. A key can often be derived from data corresponding to an event, e.g., a "machine-id," "location," "device type," "customer number," "vehicle identifier," etc. In an aspect, an event can be associated with a key, however, data yet to be written into an event can be associated with an access target value that can have the same value as the key, e.g., the access target value can be determined based on the data of the event, a characteristic corresponding to the event to be recorded, etc., such that the access target value can be regarded to be the same as a key of a corresponding written event, data object, etc. Accordingly, the term event key, hashed key value, access target value, key, etc., can be used interchangeably for convenience unless the context indicates a more specific use, for example, an access target value can correspond to data to be stored in an event and can be derived from that data or other characteristics corresponding to the data such that when the event is stored the access target value can be used as the key associated with storing the event. Similarly, in a read operation, an access target value can be indicated to allow access to an event having a key that matches the access target value because the event was written to the OES according to a key that can be the same as the access target value. Generally speaking, the term access target value can relate to a 'key value' such that access to events of an OES can be based on comparing the access target value to key values for actual stored events, where an existing event is to be read, or key values that will be used to store an event, where an event will be written into the OES at the access target value. Again, it is generally easier to just use the term key for both access target value and routing key unless more specificity is needed in some given example, and this convention is generally used in the instant disclosure for simplicity and brevity, as an example, a key can be determined when an event is stored, e.g., the event is stored according to the key, such that a read instruction for events of 'the key' can return event(s) stored according to the key. Events with the same routing key can be written to a corresponding stream or stream segment, and can also be consumed, e.g., read, in the order they were written to the stream or stream segment.

In an aspect, an OES can comprise one or more stream segments. A segment of an event stream can generally be associated with a single processing instance to assure ordering of the events logically added to the segment. A processing instance can be a single real physical processor, a virtualized processor executing on one or more real physical processors, a group of real physical processors, a group of virtual processors executing on one or more real physical processors, etc. As an example, a processing instance can be a blade server of a rack system. As another example, a processing instance can be a virtual processor deployed in an elastic computing system, e.g., a 'cloud server,' etc. Typically, the processing instance can be associated with a level of performance which, in some embodiments, can be measured via one or more key performance indicators (KPIs) for the processing instance. As an example, a first blade server of a rack can have a first level of performance and a second blade server of a rack can have a second level of performance. In this example, where the two blade servers can comprise similar hardware and environments, they can have similar levels of performance. However, also in this example, where the two blade servers comprise different hardware and/or are in different environments, they can have different, sometimes substantially different, levels of performance. As an example, per unit time, a first processing instance can perform one unit of work, a second processing instance can perform one unit of work, a third processing instance can perform five units of work, a fourth processing instances can perform three units of work, etc., where the unit of work can correspond to a number of event stream operations that can be performed per unit time by the processing instances, e.g., reads, writes, etc. In this example, the first and second processing instances can perform similar amounts of work in an event stream storage system, while the third processing instance can be capable of up to five times the work of either the first or second processing instance. Generally, the computing resources of a processing instance can be associated with costs, e.g., monetary costs, electrical consumption costs, dispersion of generated heat costs, support or manpower costs, real estate for deployment costs, etc. As such, selecting an appropriate processing instance can be associated with optimizing cost(s). As an example, if an event stream consumes less than one unit of work, then pairing the stream with a processing instance that can perform one unit of work can be a more optimal use of computing resources, e.g., lower overall aggregate costs, etc., than pairing the event stream with a processing instance that can perform 200 units of work which can result in 'wasting' up to 199 units of work through underutilization. Moreover, in this example, the 200 unit processing instance, for example, can be a newer high end processing instance that can have a high monetary cost, and generate more heat than the one unit processing instance that, for example, can be a low cost commodity processing instance that is plentiful, has a low monetary cost, and is already widely deployed. As such, paring the one unit of work event stream with a race car of a performance instance can be understood as possibly not being an optimal pairing in comparison to a more pedestrian performance instance.

Where an OES can be comprised of one or more portions, e.g., segments, shards, partitions, pieces, etc., that can generally be referred to as segments for convenience, a segment of an OES can act as a logical container for one or more events within the OES. When a new event is written to a stream, it can be stored to a segment of the stream based on a corresponding event routing key. An event routing key can be hashed with other event routing keys to form a "key space". The key space can be employed to 'divide' the stream into a number of parts, e.g., segments. In some embodiments, consistent key hashing can be employed to assign events to appropriate segments. As an example, where a stream comprises only one segment, all events to be written to the stream can be written to the same segment in an ordered manner and the only one segment can correspond to the entire key space. As another example, where a stream comprises two segments, the key space can be associated with the two segments, e.g., the total key space can extend from zero to 'n', however each of the two segments can be associated with a portion of the total key space, for example, the first segment can be employed to store events with a key between zero and 'm' and the second segment can be employed to store events with a key between 'm+1' and 'n'. It will be appreciated that more segments can be employed to further divide the key space such that a segment can store an event with a key falling within the range of the key space associated with that segment. As an example, a four segment OES can have each segment store data for a quarter of the total key space, e.g., segment A can store events with keys from 0 to <0.25, segment B can store events with keys from 0.25 to <0.5, segment C can store events with keys from 0.5 to <0.75, and segment D can store events with keys from 0.75 to 1.0, etc. Other example divisions of the key space in this example, such as asymmetric division of the key space, etc., are readily appreciated as within the scope of the instant disclosure even where they are not further recited for the sake of clarity and brevity.

Moreover, an OES stream can have a topology that evolves. An evolution of an OES topology can be related to different epochs. As an example, an OES can initially have a first segment, but where writing of events transitions a threshold level, the OES can be scaled to comprise two segments, e.g., a second segment and a third segment. In some embodiments, each of the second and third segments can employ a separate processor instance to write events, e.g., scaling the OES can correspond to an increase in the count of processors writing events to the OES. Accordingly, a hashed key space can be divided to encompass the second and third segments of the scaled OES, e.g., the example OES can initially have the first segment covering a key space of 0 to 1, and after the scaling, the second segment can cover events from zero up to 0.25 of the key space and the third segment can cover events from 0.25 to 1 of the key space. The example scaling of the OES can constitute an 'epoch change', e.g., evolution of the topology of the OES, such that before the scaling the OES had the first segment in a first epoch, e.g., 'Epoch 1', and, after the scaling, the OES can have a second and third segment in a second epoch, e.g., 'Epoch 2'. In an aspect, the first segment can be closed at the change in epoch, and thereby, the second and third segments can correspondingly be opened at the epoch change. In this way, in Epoch 1 there is one segment for all of the key space zero to one and, in Epoch 2, there are two segments, each covering a portion of the total key space. In an aspect, storage schemes can be different in different epochs, e.g., the topology change of the OES can result in a change in storage scheme. Returning to the above example, reading an event with a key space value of 0.75 in the first epoch can read from the first segment and can be distinct from reading another event with a key space value of 0.75 in the second epoch that would read from the third segment. The use of different storage schemes for events of an OES, e.g., an OES having different OES segment schemes across epochs of an OES, can be associated with reading out OES events according to those different storage schemes in their corresponding epochs. It is noted that the content written into events can remain consistent even though the logical and/or physical storage of said events in different epochs can be altered. As an example, writing temperature readings into events of a one-segment stream that is scaled to a two-segment stream due to an increase in a number of events being written can still write temperature data into the events in an ordered manner, e.g., the content remains consistent, although the physical storage can be altered, for example, in the one-segment portion of the OES the events can be written to a single server while in the two-segment portion of the OES the events can be written to two different servers located remotely from each other, e.g., according to keys for the events of the OES. In other examples, the segments in both the one-segment and two-segment portions of the OES can be on a same server, can exist across multiple servers, etc., however, the events can remain consistent in storing the example temperature data.

An OES storage scheme can correspond to a distribution of a hashed key space to segments of an OES. As an example, a first OES storage scheme can have a hashed key space extends from 0 to 1, wherein a first segment can store events having a hashed key value 'y' between 0 and 0.28, e.g., $0 \le y < 0.28$, and a second segment of the OES can store events having 'y' between 0.28 and 1, e.g., $0.28 \le y < 1$. The example first OES storage scheme can be altered to a next storage scheme, e.g., advanced to a second epoch, wherein the first and second segment can be closed and a third and fourth segment can be opened wherein third segment can store events having a hashed key value 'y' between 0 and 0.7, e.g., $0 \le y < 0.7$, and the fourth segment of the OES can store events having 'y' between 0.7 and 1, e.g., $0.7 \le y < 1$. Moreover, the second epoch can end when a third epoch is begun that represents a third OES storage scheme, for example, closing the third and fourth segments and opening fifth through seventh segments, wherein the fifth segment can store events having a hashed key value 'y' between 0 and 0.1, e.g., $0 \le y < 0.1$, the sixth segment can store can store events having 'y' between 0.1 and 0.5, e.g., e.g., $0.1 \le y < 0.5$, and the seventh segment can store can store events having 'y' between 0.5 and 1, e.g., $0.5 \le y < 1$.

Generally, changes to an OES storage scheme, e.g., an epoch change, etc., can be in response to an indication that computing resources transition a level of burden, e.g., where a processor becomes burdened, another processor can be added and the key space can be divided between the increased number of processors in a new epoch. An event stream can be divided, symmetrically or asymmetrically, to increase an amount of computing resources available to each segment of an OES. As an example, if an initial event stream causes a load of two units of work for a first processor, and the two units of work load correspond to an even distribution of work across the associated key space of the initial event stream, and the two units of work can exceed a threshold work level of the example first processor, then the stream can be split into two segments and a second processor can be added. In this example, after the scaling of the stream, the first processor can now support a second segment, in lieu of the initial one segment, at about one unit of work and a third segment can be supported by the second processor, also at about one unit of work, assuming the work load from the initial stream was roughly evenly split between the key spaces of the new epoch.

Transitions between OES epochs, e.g., changing OES storage schemes can be related to changing write and read demands associated with a stream of data. As an example, writing ride share service events to an OES can be according to OES segments that can divide the hashed key space into regions, e.g., a west region, a central region, and an east region. In this example, as peak demand for ride share services can be associated with the time zones, for example being busier in the east zone at local 5 pm than in the west zone that could be at a local time of 2 pm. A such, there can be more demand, in this example, to write data to the OES segment corresponding to the east region and the storage scheme can meet this demand by scaling the OES segment to allow more east region data to be written, e.g., splitting the example OES segment to more segments to allow engaging more processors, which, in some embodiments, can divide the hashed key space related to the now plural OES segments for east region event writing. Moreover, as time continues, demand can increase in the west region and wane in the east region, for example 5 pm in the west can be 8 pm in the east. As such, the east region segments can be scaled down and the west region segments can be scaled up, e.g., effectively shifting processing power to storage of west region events rather than east region events. The change in scaling of the segments of the OES can be associated with a change in storage scheme and a change in OES storage epochs, etc.

As stated elsewhere herein, an OES can generally store events in an append-only format, e.g., events can be iteratively added to an additive terminus resulting in an ordered stream of events. This can result in storage of very large data event, data object, etc., sets that can consume large amounts of physical storage, memory, etc., on one or more storage devices that can be located locally, remotely, or some combination thereof. In embodiments, writing data can be associated with metadata that can facilitate reading of the data back form the OES. As an example, events of an OES can first be written to a first hard drive. As some point the first hard drive can become full enough to trigger writing to continue on a second hard drive in lieu of the first hard drive. The example, in this instance the OES storage system can facilitate reading of the events via metadata indicating that the OES begins on the first hard drive and continues on the second hard drive, e.g., the metadata can indicate bridging of the OES between the two hard drives. This can be important in that OES events are typically not stored with, or near to, event location information, which can make addressing a specific OES event difficult. In this regard, a start of an OES can be indicated allowing writing/reading of events to begin at the start and simply read down the stream, across any bridges, and until an end, wherein each event is, for example, of a unit size to allow for parsing of the stream of bits into meaningful OES events. This can be distinctly different from a conventional addressable event storage system, where events are written to specified storage locations and can be read based on a provided event address, event identifier, etc. The OES can consume less space by not addressing each event, e.g., rather supporting pointing to a head and then parsing read data by event unit size, however the OES can suffer from being less directly addressable. In some embodiments, a specific event can be read by multiplying the event unit size by the count of the event to be read, adding that to the head of the OES and then reading data from a resulting storage location, although this can be more complex where there can be bridging between storage locations. In an analogy, conventional data storage can be viewed as a metal chain, where each link can be individually recognizable, while an OES can be viewed as a rope, where you can begin at an end of the rope, but events are only recognizable where you then cut the rope into pieces of a unit size.

It can be desirable to test a storage system by verifying that the storage system can store data with an acceptable level of corruption, typically low or no corruption of the stored data, e.g., it is generally considered bad that data out of a storage system is different than the data that went into the storage system. As an example, endurance testing can verify that content of stored events is not corrupted with a lapse of time. To facilitate the example endurance testing, a testing tool can generate many data events, store these events within the storage system, and subsequently read the events back from storage and verify their contents. In between creating and verifying a given event, a large number of input/output (I/O) operations can be performed over some relatively long time period, including creating and deleting other events. Conventionally, stored event verification can generally use a calculated checksum determined for the event when it is written, store the checksum, and then when the event is read back, a second checksum can be calculated for comparison. If the checksums are equal, the event content can be deemed as verified. Otherwise, the event can be reported as corrupted. However, checksums are understood to not be one-to-one functions and a same checksum value can be computed for different event data. Accordingly, event content verification using checksums is generally never considered to be perfectly reliable.

In embodiments of the disclosed subject matter, OES event metadata can be employed to verify an event, for example, as part of endurance testing, etc. The metadata for OES storage systems can be distinct from that employed in conventionally addressable data object storage. Accordingly, the metadata can be employed by a function to regenerate the data originally stored in an event. This regenerated data can then be compared to data read from the event. Where the read data and regenerated data match, the event can be verified. This can support testing of an OES storage system to give a level of confidence, performance, etc., for the storage of data via events of an OES written into the OES storage system, e.g., endurance testing, etc.

Embodiment of the disclosed subject matter can assure 100% reliable data verification while staying extremely compact in the terms of disk capacity use. Moreover, the disclosed subject matter can verify an order of events within an OES. Events to be created on OES storage for verification typically contain bytes from some Quasi-Random Reproducible Sequence of Bytes (QRRSB) function. The QRRSB function can reproducibly take one or more input value(s) and output a corresponding output value, e.g., a same input to the QRRSB function generates a same output. In conventional addressable data object storage, example inputs can be an event identifier/address (ID) and an event size ('S') and corresponding example outputs can be 'S' bits to be stored at that address. Accordingly, in this example for conventional addressable storage, verifying the stored data can include reading the S-bits from the event address, passing the event address and size to the QRRSB function to regenerate the S-bits, then comparing the regenerated S-bits to the read S-bits to verify they are the same. However, in an OES, events are not typically addressable, see the above chain and rope analogy, as such, the is of ID and size used for conventional addressable objects does not easily port to verifying OES storage systems. This can be even more profoundly true where OES storage system testing includes scaling of OESs as disclosed elsewhere herein, e.g., the logical arrangement of events for a scaled OES can dynamically change in a manner that is not obviously manageable for test tools that rely on an event address and size as inputs to a QRRSB function as part of verification of stored data.

As such, the disclosed subject matter can determine a level of parallelism for an identified OES, wherein the parallelism corresponds to a number of event writers for the named OES. Additionally, a size of OES events, and a number of events for each event writer can be determined. This information can be stored as metadata and can be employed in conjunction with a QRRSB function(s) to generate test data for storage in an OES storage system. The stored events can then later be read and compared to regenerated event data based on the QRRSB function(s) and the stored metadata for verification. It is noted that scaling of the OES during storage of test events does not alter the content of the stored event, rather just the logical/physical ordering of the stored event, and therefore the verification can still be determined without need to explicitly track OES parameters related to scaling at the time of writing and at the time of reading, e.g., the fact that some stream had one or multiple scaling events does not change the content of the streams because the set of events remains the same, rather, what is changed is the way this content has been stored, e.g., location of the stored events, etc. Therefore, the parameters related to OES scaling do not typically need to be shared between the two modes of the disclosed testing tool, e.g., the write mode and verify mode do not need to be aware of scaling of the OES in the other mode. This advantage can therefore specifically enable testing of an OES storage system intentionally undergoing OES scaling, e.g., the disclosed testing tool can be instructed to intentionally throttle up/down writers periodically, randomly, repeatedly, etc., wherein performance of each writer, for example, can be set to selected and/or random values, such as between 50% and 100% loading. As such, when performance of different writers can change independently, the structure of the OES can undergo a wide variety of transformations. This can more accurately test 'real world' deployment conditions for an OES that can include scaling features desirable to customers.

In an example embodiment, the disclosed testing tool can store the following metadata at writing to enable regeneration for validation, a stream name (Name') as a string, a level of parallelism within the stream ('N') as a long integer; an event size ('S') as a long integer; and a number of events per writer ('M') as a long integer. Long integers can be termed 'a long,' longs,' etc., and can typically comprise 32 bits of data in a 32-bit computer system, 64 bits of data in a 64-bit computer system, etc., as will be familiar to anyone with basic programming experience, the term 'long' is used predominantly hereinafter. Amazingly, this small bit of metadata, e.g., a string, and three longs, along with a QRRSB function(s), can enable complete and accurate description of the content of an OES of an arbitrary size, for example, $10^9$ events of 5 MB each. As an example, a OES storage system can add a new data center. The example OES storage system can then employ the presently disclosed testing tool to write events to every storage location of the newly added data center as an OES, wherein the OES can undergo scaling as part of the testing. The example test tool, for example after a designated endurance testing time, can then employ the four above noted parameters to regenerate all of the stored events for comparison to events read from the OES storage system's new data center. The comparison can enable verification of the data based on matching between the read event data and the regenerated event data. This can be 100% reliable, unlike more conventional checksums. Moreover, the order of the stored events, arguably an important feature of an ordered event storage system, can also be verified.

In this example embodiment, then Name can be input to a QRRSB function to generate N stream writers that can each be associated with a unique routing key, for example, each 30 bytes of the output of QRRSB(Name) can be used as a routing key for a writer of the N writers. Similarly, Base64 encoding can also be employed to make a routing key string for a sequence of bytes from QRRSB(Name). This can be regarded as N rows of OES writes. Further, for each writer, the routing key can be used by a QRRSB function, which can be a different QRRSB function or a same QRRSB function, to generate events in the 'row', QRRSB(writer key)→events for that specific writer, e.g., resulting in 'M' columns of events across the 'N' rows of writers. This can be visualized as an N×M array of events of size S that can perfectly reflect the test data stored in the example new data center. It is noted that the internal structure of events is irrelevant for endurance testing, e.g., each event can be regarded as a byte array of size S. In the example embodiment, a portion of the test data can comprise sequence information. In the instant example, the first few bytes of each event can be set to contain information, e.g., sequencing information, that can be used later on to verify an event's order. As a particular example, 4+4 bytes of each event can be reserved for two types of sequencing information, e.g., writer sequencing and event sequencing, with just one machine word. The example sequencing information can contain a sequence number of a writer and a sequence number of an event created by that writer. The remaining S-8 bytes can then be filled from the that writer's QRRSB function, e.g., QRRSB(writer key) output. A writer can finish after creating the M events. After all the N writers have finished, the example new data center can comprise an OES that can contain the N×M events, with S bytes in each event. It is noted that some embodiments can comprise different counts of events for different writers, for example a first writer can write 50,000 events and a second writer can write 250,000 events, without departing from the scope of the disclosed subject matter, but the discussion of these embodiments becomes repetitive and unduly verbose and therefore, for the sake of clarity and brevity, the remainder of the disclosure employs the N×M event matrix as an easiest to understand and less verbose illustration, although the claims are not so limited.

Verification of the instant example new data center can be based on reading the events from the data center, verifying the order via the sequencing information, then comparing the example S-8 bytes of stored data against regenerated data based on the stored metadata, e.g., Name, N, M, S, and the QRRSB function(s). In this regard, everything the disclosed tool needs for verification is the aforementioned four parameters, which is exceedingly compact in comparison to storing duplicates of all the data, storing (imperfect) checksums, etc. For verification, the disclosed tool can create a reader group with N readers to read the OES events from the example new data center after a selected endurance test time. The readers can send the events they read to corresponding N verification threads, where each verification thread can be a counterpart of a specific writer used to write the test data into the OES stored in the new data center, for example, an $i^{th}$ verification thread verifies events created by an $i^{th}$ writer.

Each verification thread can use the four parameters that describe the stream to reconstruct all the events created by that specific writer. When a reader reads another event from the OES storage system, that reader can be unaware of which event it is because the OES storage system typically does not store any identification information in or next to an event, as disclosed elsewhere herein. The reader can then read the sequencing information, in this example, form the first 8 (4+4) bytes of each event. The reader can use the first 4 bytes to identify the writer used to write the data into the OES and can therefore verify the $i^{th}$ verification thread that will verify the event. The reader, accordingly, can sends the event to the corresponding $i^{th}$ verification thread. The $i^{th}$ verification thread can then check the event order based on the second 4 bytes of the event and the sequence of the previous event from the $i^{th}$ writer, e.g., to verify that the event is the 'next event' created by the $i^{th}$ writer. If it is determined that the event sequence is out of order, an ordering failure can be reported. If the event passes the order check, the $i^{th}$ verification thread can compare the next S-8 bytes from the QRRSB associated with the $i^{th}$ writer with the remaining event bytes read from the OES, e.g., performing a byte-to-byte comparison between the regenerated event data and the remaining event bytes. Where the byte arrays are equal, the event can be determined to pass verification. Otherwise, corruption of the event can be reported. The stream can be said to pass verification when all its events have passed order and content checks. The stream can fail verification when a selected level of failures has occurred, for example, when one or more events have failed one or more checks.

To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages, and novel features of the disclosed subject matter will become apparent from the following detailed description when considered in conjunction with the provided drawings.

FIG. 1 is an illustration of a system 100, which can facilitate verification of test data in an ordered event stream storage system, in accordance with aspects of the subject disclosure. System 100 can comprise a storage component 102 that can store an ordered event stream (OES) 110, 111, etc., which can store representations of, reference to, etc., an event, which can sometimes be referred to as a data object, object, or similar term. An OES can store one or more events. An event can be associated with a key, e.g., a routing key. A key can typically be determined from an aspect or characteristic of, or corresponding to, an event, although other key determination techniques can be employed without departing form the scope of the presently disclosed subject matter. As an example, a key can be based on a characteristic of the source of the event data, such as a customer identifier, machine identifier, a location of a device providing the event data, a type of a device/sensor/machine/computer providing the event data, etc. Events can be written to an OES in an ordered manner and in accord with a key, e.g., events with a same key can be written to a same portion, e.g., segment, etc., of an OES while also being written in an ordered manner. Similarly, events can be read from an OES, generally in an ordered manner, also according to a key, e.g., typically events are read in the order in which they were previously written into a portion of an OES corresponding to the event key. A component(s) providing data for events to be written can be termed a 'writer(s),' e.g., a writer application instance, etc., and a component(s) requesting data from events can be termed a 'reader(s),' e.g., a reader application instance, etc. As such, a writer can provide data to processor component 104 for an event that can be written to a portion of an OES, e.g., OES 110, 111, etc., in an ordered manner based on a key associated with the event. Similarly, a reader can receive data from processors component 104 for an event stored in a portion of an OES, e.g., OES 110, 111, etc., based on a key.

Processor component 104 of a system 100 can receive write(s) 106 that can be written to OES 110, 111, etc., to be stored via storage component 102. Processor component 104 of a system 100 can provide access to events based on a key, e.g., as read(s) 107 that can be communicated to a reader. Generally, one processing instance, e.g., processor component 104, etc., can be designated for writing events to a portion, e.g., segment, of OES 110, 111, etc. OES 110, 111, etc., can comprise one segment and/or parallel segments that can store events according to a key. In an aspect, more than one processing instance writing to a segment of an OES, while allowable in some embodiments, is typically disfavored because it can increase the difficulty of writing incoming events in a properly ordered manner, although orchestrated writer groups, e.g., orchestrated groups of writers acting as a single writer group, writing to a segment is not uncommon. Further, a given processing instance can read, write, etc., to more than one OES segment, e.g., a given processing instance can write to one or more OESs, to one or more segments of one OES, to one or more segments of one or more OESs, etc. Generally, for a given number of segments there can typically be up to the same number of processing instances. Although adding more processing instances is allowable, these additional processing instances can generally be left idle to avoid possible scrambling of an order of events being written to a segment. It is further noted that idle processing instances, where comprised in system 100 for example, can act as reserve processing instances, such as to allow for failover where an active processing instance becomes less responsive, etc.

In an aspect, keys of one or more segments of an OES can represent a key space for OES 110, 111, etc. Segments can therefore act as logical containers associated with a particular range of keys for an event stream and can be used to store events within an OES. When a new event is written to a stream, it can be stored to one of the segments based on the event key. In an aspect, the key space can be divided into a number of ranges that can correspond to the number of segments comprising an OES. As an example, a key space for an OES can be from 0 to 100, the OES can comprise two parallel segments wherein the first segment sequentially stores events with, for example, keys from 0 to 30 and the second segment sequentially stores events with keys from >30 to 100. In this example, a first event with a key of 54 can be appended to the second segment, a second event with a key of 29 can be appended to the first segment, a third event with a key of 14 can be further appended to the first segment after the second event, etc.

OES 110, as illustrated in system 100, can be a simplistic example of an OES that can comprise just one segment for storing incoming event write(s) 106 and sourcing event read(s) 107, and therefore the key space of OES 110 can be embodied in an example single segment with events that can have an origin terminus 112. A first event can be written at origin terminus 112. Subsequent events can then be appended at an additive terminus 114 that is typically at the head of the stream of written ordered events, e.g., a most recent event is written to the head of example OES 110, which can provide ordering of the events being written. This can result in example OES 110 allowing for continuous and unbounded data storage that can be a durable, elastic, append-only, unbounded sequence of events. As an example, a $(K+1)^{th}$ event can be appended to the $K^{th}$ event of example OES 110 at additive terminus 114. In an aspect, storage component 102 can store any number of OESs, e.g., OES 110, 111, etc. Moreover, any one OES can comprise any number of parallel segments, e.g., strings of events for a defined key space range. Each segment can comprise an ordered sequence of stored events. The key space of an OES can evolve, e.g., through different epochs, to comprise different numbers of OES segments as is disclosed elsewhere herein. The key space can be symmetrically or asymmetrically divided and can be, but is not required to be, contiguous.

In system 100, data verification component (DVC) 120 can facilitate verification of test data in an ordered event stream storage system. In an aspect, DVC 120 can facilitate writing test data to an OES storage system. Moreover, DVC 120 can facilitate data verification related to test data written to the OES storage system. In an embodiment, DVC 120 can write test data based on a QRRSB function and OES parameters stored as metadata, for example, the OES parameters can be a stream name ('Name'), a level of parallelism within the stream ('N'); an event size ('S'); and a number of events per writer ('M'). Generally, the metadata and QRRSB functions can enable perfect regeneration of all test data written into an OES storage system. Moreover, compared to full replication of written data, use of checksums that typically do not offer a one-to-one relationship and therefore are generally imperfect for verification, the use of the OES parameters and QRRSB function(s) is exceedingly storage space efficient, e.g., storage of stream replicas or checksums can consume significantly more storage, often by orders of magnitude of large OES storage system tests, than the presently disclosed verification tool technology. Moreover, DVC 120 can regenerate stored test data based on the OES parameters to enable comparison to test data read from the OES storage system. Where the read data and the regenerated data match, the data can be verified. Moreover, the disclosed subject matter can implement sequence information into the written test data, such that upon reading the test data, verification of the order of the test event in the OES storage system can also be verified. The OES storage system can be determined to be verified based on the number of verification failures for the test data, e.g., where the test data has no failures the OES storage system can be verified as perfectly preserving the written events for the duration of the test.

Figure 2:
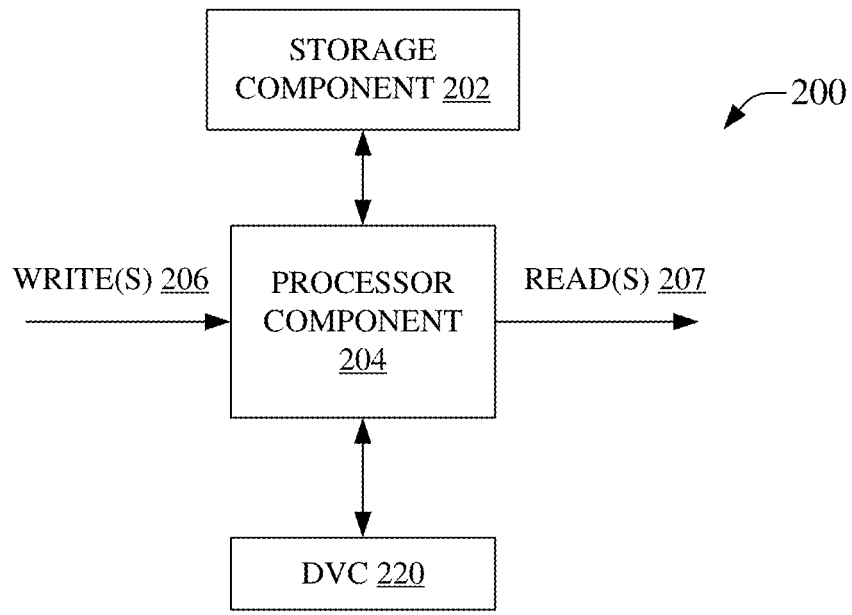
FIG. 2 is an illustration of an example system enabling verification of scalable test data via one or more segments of an ordered event stream storage system, in accordance with aspects of the subject disclosure.
Figure 2:
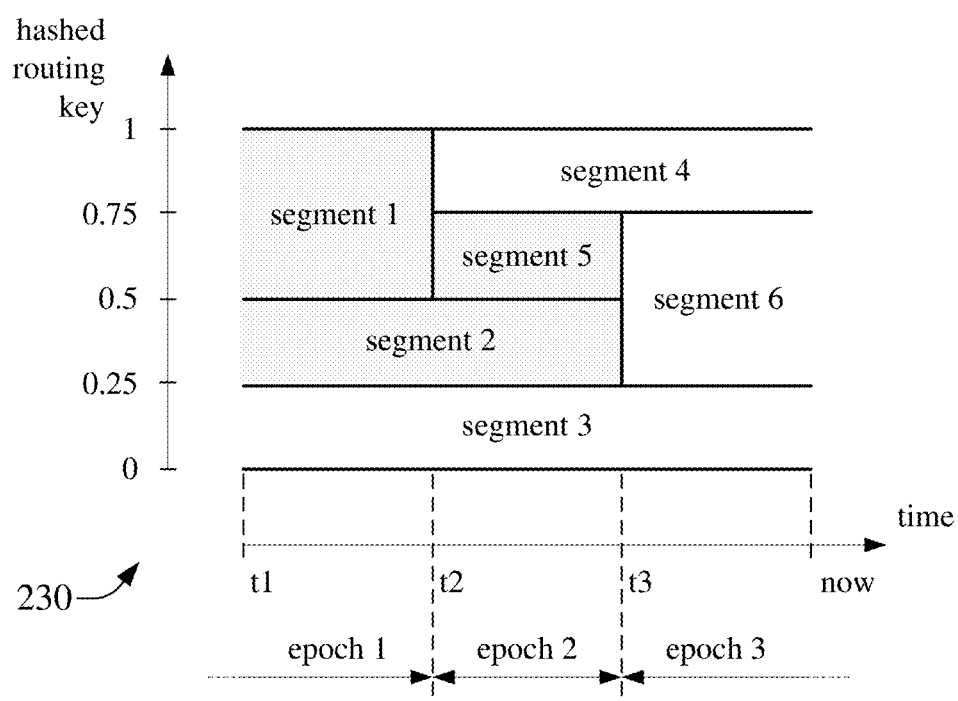

FIG. 2 is an illustration of an example system 200 enabling verification of scalable test data via one or more segments of an ordered event stream storage system, in accordance with aspects of the subject disclosure. System 200 can comprise a storage component 202 that can store an OES that can store one or more events according to a routing key that can be determined from aspects of the event. Events can be written to an OES in an ordered manner, e.g., via write(s) 206, and can be read from the OES in an ordered manner, e.g., via read(s) 207. In an aspect, keys of one or more segments of an OES can represent a key space. Segments can therefore act as logical containers associated with a particular range of keys for an event stream and can be used to store events within an OES.

Ordered event stream system 200 can comprise segments. At a first time, for example at t1 of 230, OES system 200 can comprise one or more parallel segments, e.g., segment 1, segment 2, segment 3, etc. At some point a segment can be scaled. As an example, at t2 of 230, segment 1 can be scaled up. This can result in causing segment 4 and segment 5 and correspondingly sealing segment 1. The topology of the OES, illustrated at 230, comprising segments 1-3 pre-scaling can be designated as epoch 1. Similarly, the topology of the OES comprising segments 4-5 and 2-3 can be designated as epoch 2, also as illustrated at 230.

In an aspect, segments 2 and 3 can be continuous across epochs 1 and 2, while segment 1 can end at the transition from epoch 1 to 2. In an aspect, in epoch 1, events associated with a key between 0.5 and 1, e.g., 0.5>key≥1, can be written (and read from) segment 1, while in epoch 2, events associated with a key between 0.75 and 1, e.g., 0.75>key≥1.0, can be written (and read from) segment 4 and events associated with a key between 0.5 and 0.75, e.g., 0.5>key≥0.75, can be written (and read from) segment 5. As such, access to events for a given key can be associated with reads in different epochs. As an example, reading an event with a key of 0.8 can read from both segment 1 and segment 4. Where the read can be from head to tail, the read of example events with a key of 0.8 can begin reading in segment 4 and then continue reading into segment 1 across the epoch boundary between epoch 2 and 1. Similarly, where the read can be from tail to head, events associated with the example key of 0.8 can begin in segment 1 and continue into segment 4 across the epoch boundary. However, it is noted that generally no additional events can be written into segment 1 after the scaling event is committed and a new epoch is begun.

In epoch 2, at 230, the topology of OES system 200 can comprise segments 4-5 and 2-3. Further scaling can be later undertaken, e.g., at t3 of 230. OES system 200 can, for example, scale down by condensing segment 2 and 5 into segment 6 at t3, that is, segments 2 and 3 can be sealed and segment 6 can be created. This example scaling down can reduce a count of segments comprising OES system 200. The scaling at t3 of 230 can result in ending epoch 2 and beginning epoch 3. As such, in epoch 3, the topology of the OES comprising segments 3-4 and 6 post-scaling in 230 can distribute the key space of OES system 200, for example, as 0≤segment 3>0.25, 0.25>segment 6>0.75, and 0.75>segment 4≥1.0.

In system 200, DVC 220 can facilitate verification of test data stored via storage component 202 and that has been scaled via through one or more epochs, e.g., epoch 1 to epoch 3, etc., of an ordered event stream storage system 200. In an aspect, DVC 220 can regenerate events from OES parameters, as disclosed elsewhere herein, for comparison to event data read from the segments of the OES, such as those illustrated at 230. It is noted that the reading of test events written into storage component 202 can be read back according to normal OES operations, e.g., processor component 204 can determine how to read back events stored in one or more storage elements of one or more storage devices comprised in storage component 202 that can be located locally or remotely from other storage elements. Moreover, the reading of events can be performed according to the scaling of the OES at the time of reading, which can be the same as, or different from, scaling of the ORES at the time of writing. It is noted that the content of the OES events, weather comprising actual customer data or test data, remains consistent despite scaling because scaling alters where data is stored, either logically or physically, but does not affect the content of the stored data because management of the OES links disparate portions of a continuous string of written events and typically does not store addressing information for individual written events, rather events are strung together from a stream tail and generally have an event unit size. Where one stream transitions from a first block of storage elements to a second block of storage element is storage component 202, processor component 204 can indicate, and cause to be stored as part of OES management data, bridging information. Returning to the earlier chain and rope example, the rope can analogously comprise pieces of rope tied together into a single rope, e.g., a single OES can comprise bridged blocks of storage space so that the OES appears logically continuous even though it might hop among different physical storage locations. This aspect is managed outside of the presently disclosed verification tool and, as such, the verification tool can request that data be read back for verification against regenerated data without concern from where it is physically stored. Again, the content of the regenerated test data is determined from the OES parameters and can be compared to read test data without needing to track scaling information between the writing and verification modes.

Figure 3:
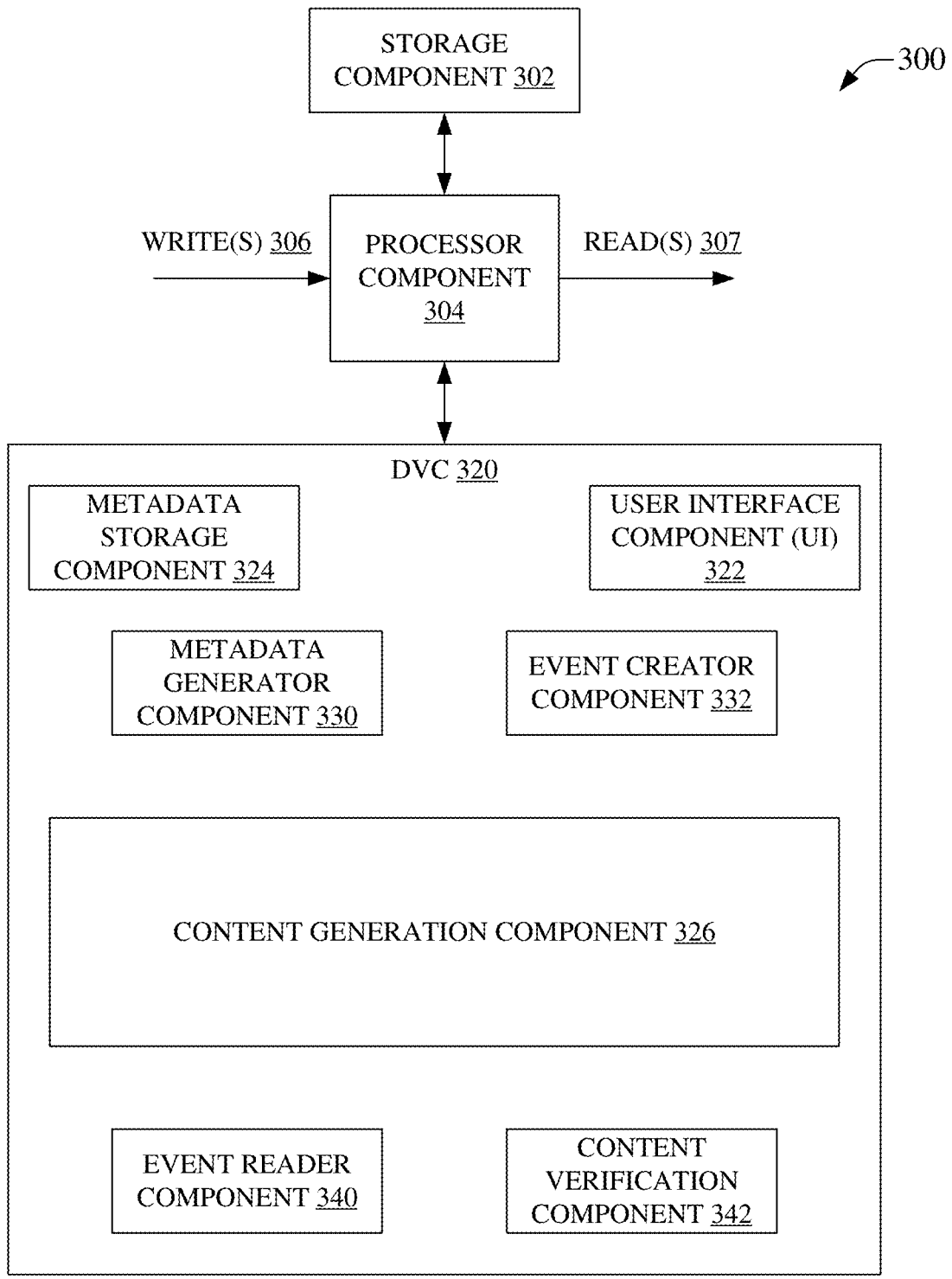
FIG. 3 illustrates an example system that can enable verification of test data in an ordered event stream storage system via a data verification component that can be attached to a typical ordered event stream storage system, in accordance with aspects of the subject disclosure.

FIG. 3 is an illustration of a system 300, which can facilitate verification of test data in an ordered event stream storage system via a data verification component that can be attached to a typical ordered event stream storage system, in accordance with aspects of the subject disclosure. System 300 can comprise a storage component 302 that can store an OES that can store one or more events according to a routing key that can be determined from aspects of the event. Events can be written to an OES in an ordered manner, e.g., via write(s) 306, and can be read from the OES in an ordered manner, e.g., via read(s) 307. Write(s) 306 can include writes of test events from DVC 320. Similarly, read(s) 307 can include reads of test events to DVC 320, for example, to support verifying data stored in a test event. In an aspect, keys of one or more segments of an OES can represent a key space. Segments can therefore act as logical containers associated with a particular range of keys for an event stream and can be used to store events within an OES. Ordered event stream system 300 can comprise segments. In an aspect, system 300 can store events according to segments, for example, as illustrated at 230 of FIG. 2. As such, DVC 320, in this embodiment, need not be burdened with management of the OES event storage other than to request that events be written into a test OES, or read from the test OES, to/from DVC 320, components of DVC 320, or other corresponding unillustrated components.

DVC 320 can facilitate verification of test data, and, in the illustrated example embodiment, can be attached to a typical ordered event stream storage system, illustrated as embodying processor component 304, storage component 302, write(s) 306, and read(s) 307. DVC 320 can comprise user interface component (UI) 322 that can may include graphical and/or textual-based interfaces that can allow a user to configure tests, to execute tests against an attached OES storage system, e.g., against an OES storing test events via storage component 302, etc., and to view the results of such tests.

Figure 6:
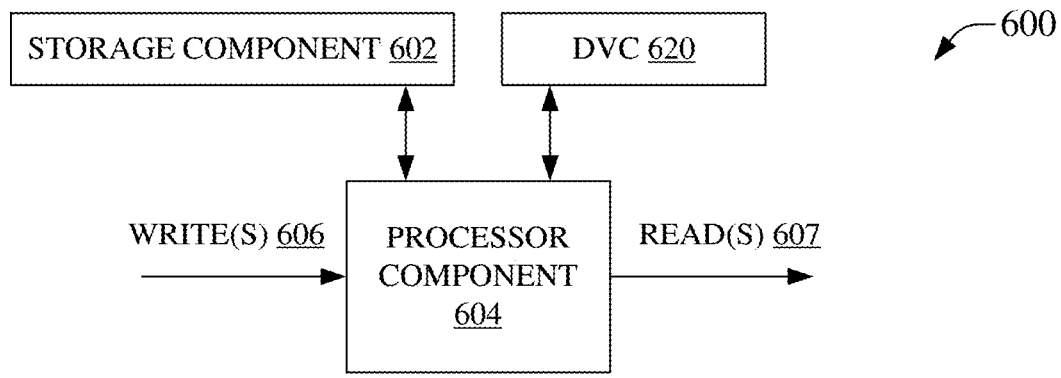
FIG. 6 is an illustration of an example system enabling verification of test data stored via an ordered event stream storage system based on OES metadata, in accordance with aspects of the subject disclosure.
Figure 6:
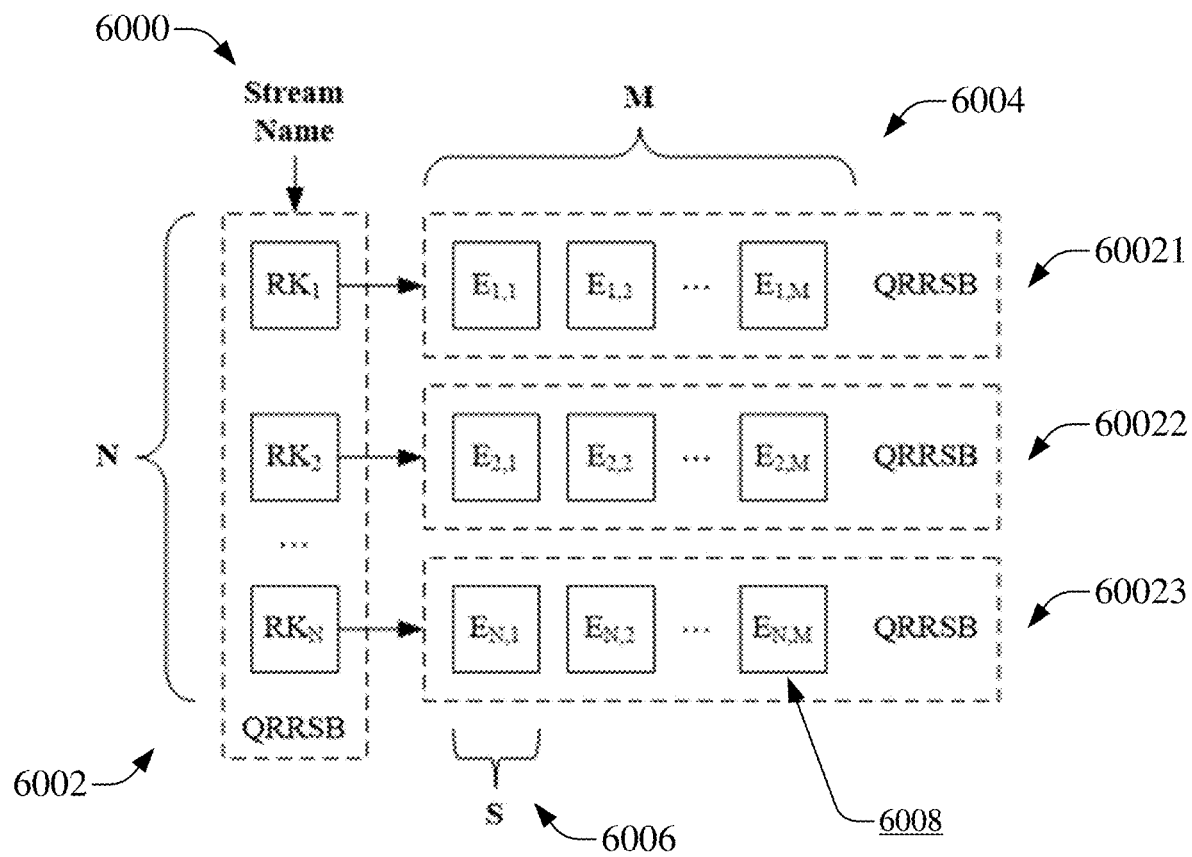

DVC 320 can further comprise content generation component 326, which can generate test data for storage in a test event. Test data generated by content generation component 326 can be reproducible, e.g., a same input can generate a same output reproducibly. In an embodiment, content generation component 326 can comprise a QRRSB function, that can return a data sequence that is reproducible based on a reproducible input, e.g., a key, wherein the same key passed into the test function will return the same data sequence every time. As an example, passing content generation component 326 an OES name can reproducibly generate a data sequence that can be employed in assigning unique keys to 'N' writer applications. In this example, the unique writer application keys can be parsed from the data sequence resulting from inputting the OES name into content generation component 326, e.g., using the first X bytes of the data sequence for a first writer, the second X bytes of the data sequence for a second writer, the $i^{th}$ X bytes of the data sequence for the $i^{th}$ writer application, etc. It is noted that other key values than the OES name can also be used, for example, a starting address of the OES tail, etc. This can result in forming N writers, e.g., 'writer 0' to 'writer (N-1)', as can be seen in FIG. 6 at 6002. Each of the N writers can then generate M events that can comprise reproducible data determined from a QRRSB function, for example, passing into the function the unique writer key (one for each of the N writers), can result in another unique and reproducible string of data that can be employed to populate the data portion of a test event to be stored, e.g., test data can be taken from the second pass through an QRRSB function. In an aspect the QRRSB function can be the same function or a different function. As an example, the $i^{th}$ writer key can reproducibly generate a string of data that can be parsed into data blocks, for example of size S, wherein these data blocks can be used to populate the test events. Accordingly, the same $i^{th}$ writer key passed into the function at a later data can reproduce the same string of data that can again be parsed into block of size S and, as such, the stored data can be compared against the reproduced data, for example, see again the N×M test event matrix at FIG. 6.

The key used by content generation component 326 can be received from metadata generator component 430 via event creator component 432. In an aspect, the metadata, e.g., OES metadata such as an OES name (Name') as a string, a value of a level of parallelism within the stream ('N') as a long; a value of an event size ('S') as a long; and a number of events per writer ('M') as a long, etc., can be determined by metadata generator component 430 based on input received via UI 322, and based on OES storage system data received via processor component 304, etc. Metadata generator component 330 can provide the metadata to event creator component 332 that can provide appropriate metadata to content generation component 326 to reproducibly generate output data that can be employed by event creator component 332 to generate test events that can be provided, e.g., as writes, to an OES storage system under test, e.g., via processor component 304. Moreover, input to, and output from, content generation component 326 to event creator component 332 can result in generating events that support an N×M array of events, e.g., events separate by hashed key space values and supporting scaling of the OES, so that they can be written into the test OES storage system accordingly, e.g., N unique writer instances that can each write M events of size S. In an example, where a OES storage system under test is testing only a single segment topology, N can be 1, resulting in only a single string of test events being passed from event creator component 332 to processor component 304 as write(s) 306. Where the test scales to two segments, the events can be distributed between the resulting two segments according to the key value determined for the test events. Additionally, event creator component 332 can pass the determined metadata to metadata storage component 324 that can facilitate storage of the metadata to support later verification of the stored test event data. In an embodiment, metadata storage can be local to DVC 320. In other embodiments, metadata storage can be located remotely from DVC 320, e.g., as a remotely located discrete storage device, at a remote server of storage component 302, via a third party, on removable/portable storage devices, via a cloud-based storage service, etc. Accordingly, DVC 320 can enable writing of test events into a OES storage system based on OES metadata that can be retained to enable reproducible regeneration of test data to support data verification testing.

DVC 320 can support data verification of test events stored in an OES storage system, for example, a typical OES storage system embodied in processor component 304, storage component 302, write(s) 306, and read(s) 307. Metadata can be retrieved via metadata storage component 324, e.g., from local and/or remote metadata storage. The retrieved metadata can be communicated to event reader component 340. Event reader component 340 can pass the metadata to content generation component 326, that can regenerate the test event data, e.g., the N×M array of test event data can be determined from one or more applications of a QRRSB function(s) to metadata inputs to reproducibly regenerate the test event data. Further, event reader component 340 can act as a reader application to request processor component 304 read events from the OES system under test, e.g., as read(s) 307. Content verification component 340 can determine verification of test event data based on the reproduce event data from content generation component 326 based on the metadata provided via event reader component 340, and on the data read from events previously stored via the OES storage system under test read back via read(s) 307. Where a read and regenerate data match, the stored test data can be verified. Where it does not match, the stored data can fail verification. Accordingly, warning can be generated and communicated to operators, etc., corrective actions can be triggered, deeper analysis can be initiated, access to parts or all of the OES storage system under test can be restricted, etc.

In some embodiments, the data written into test events can include sequencing information. Sequencing information can indicate an identification of a corresponding writer of the N parallel writers, which can result in passing the verification to a properly corresponding writer at verification, e.g., where each of the N writers has a unique key, using data from a wrong writer can result in a mismatch of data and, accordingly, data should be regenerated by a writer using the same unique key in both the writing and the verification mode. In an example, a first 4 bytes of data stored in a test event can be writer sequencing information. Moreover, other sequencing information can reflect the order of the event being written by a particular writer of the N writers. As an example, a second 4 bytes of the data stored in a test event can be compared to a sequence information for the preceding tested event to determine that the current event in testing is properly the 'next' test event of the test OES storage system for that particular writer of the N writers. This can result in the remaining 'S-8' bytes of the test event being populated with a corresponding portion of the stream of data generated based on that particular writer key. In this regard, the disclosed subject matter can test that the event is in the correct order and can further test that the remaining S-8 portion of read data matches the S-8 portion of regenerated data for that writer of the N writers. These benefits further support OES scaling in that the content of the events is unrelated to the scaling of the OES under test, e.g., the event data will be the same in a scaled and in an unscaled OES created from the same metadata and QRRSB function(s).

Figure 4:
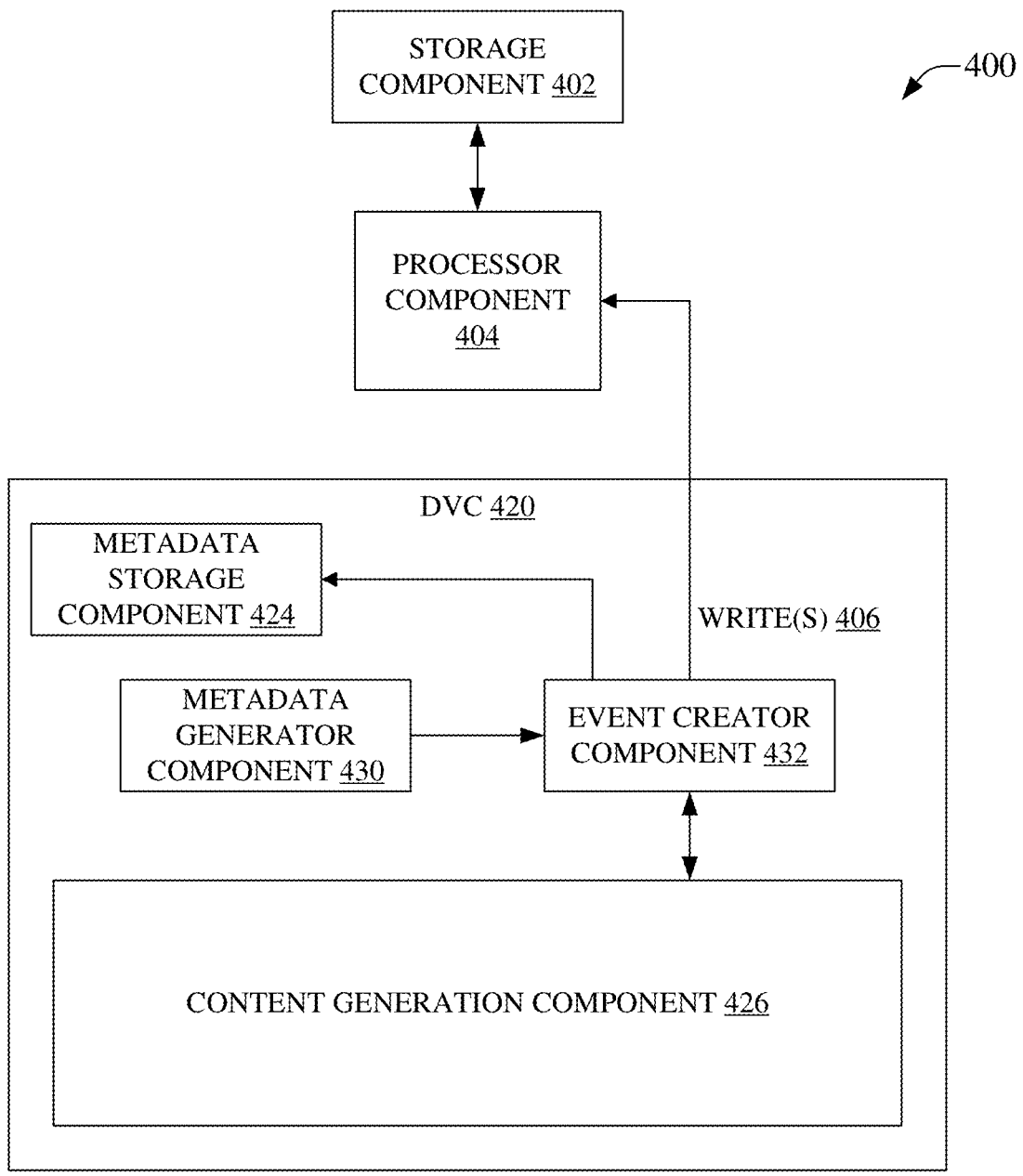
FIG. 4 is an illustration of an example system facilitating writing test data to an ordered event stream storage system, wherein the test data supports verification of the test data stored via the ordered event stream storage system, in accordance with aspects of the subject disclosure.

FIG. 4 is an illustration of an example system 400, which can enable writing test data to an ordered event stream storage system, wherein the test data supports verification of the test data stored via the ordered event stream storage system, in accordance with aspects of the subject disclosure. System 400 can comprise storage component 402 that can store an OES which, in turn, can store one or more events according to a routing key that can be determined from aspects of the event. Events can be written to an OES in an ordered manner, e.g., via write(s) 406, which can enable writing of test data as test events into an OES stored via storage elements comprised in at least storage component 402. Events, including test events, can be read from the OES in an ordered manner, for example, via read(s) 107, 207, 307, etc. In an aspect, keys of one or more segments of an OES can represent a key space. Segments can therefore act as logical containers associated with a particular range of keys for an event stream and can be used to store events, including test events, within an OES. Ordered event stream system 400 can comprise segments. In an aspect, system 400 can store events, again including test events, according to segments, for example, as illustrated at 230 of FIG. 2. In an example, storage component 402 can comprise new storage space that is to be endurance tested. In this example, write(s) 406 can be used to populate a test OES storing events via the new storage space. In this manner, in the example, test data can be written into the new storage space to support verifying the endurance/performance of the new storage space, e.g., in accord with later verification such as is illustrated for system 500. As such, DVC 420, in this embodiment, need not be burdened with management of the OES event storage other than to request that events be written into a test OES from DVC 420, components of DVC 420, or other corresponding unillustrated components.

DVC 420 can facilitate verification of test data, and, in the illustrated example embodiment, can be attached to a typical ordered event stream storage system, illustrated as embodying processor component 404, storage component 402, and write(s) 406. DVC 420 can further comprise content generation component 426, which can generate test data for storage in a test event. Test data generated by content generation component 426 can be reproducible, e.g., a same input can reproducibly generate a same output. In an embodiment, content generation component 426 can comprise a QRRSB function, that can return a data sequence that is reproducible based on a reproducible input, e.g., a key, wherein the same key passed into the test function will return the same data sequence every time. As an example, passing content generation component 426 an OES name can reproducibly generate a data sequence that can be employed in assigning unique keys to 'N' writer applications, such as by parsing a resulting data sequence based on inputting the OES name into content generation component 426. In this example, the first X bytes of the data sequence can be used for a first writer, the second X bytes for a second writer, the $i^{th}$ X bytes for an $i^{th}$ writer application, etc. This can result in forming N writers, e.g., 'writer 0' to 'writer (N−1)', as can be seen in FIG. 6 at 6002. Each of the N writers can then generate M events that can comprise reproducible data determined from a QRRSB function, for example, passing into the function the unique writer key (one for each of the N writers), can result in another unique and reproducible string of data that can be employed to populate the data portion of a test event to be stored. As an example, the $i^{th}$ writer key can reproducibly generate a string of data that can be parsed into data blocks, for example of size S-8, wherein these data blocks can be used to populate the test events where the first 8 bytes comprise sequence information for writer and event order testing. Accordingly, the same $i^{th}$ writer key passed into the function at a later data can reproduce the same string of data that can again be parsed into block of size S-8 and, as such, the stored data can be compared against the reproduced data, for example, see again the N×M test event matrix at FIG. 6.

The key used by content generation component 426 can be received from metadata generator component 430 via event creator component 432. In an aspect, the metadata, e.g., OES metadata such as an OES name (Name') as a string, a value of a level of parallelism within the stream ('N') as a long; a value of an event size ('S') as a long; and a number of events per writer ('M') as a long, etc., can be determined by metadata generator component 430 based on input received via a UI, e.g., UI 322, etc., and based on OES storage system data received via processor component 404, etc. Metadata generator component 430 can provide the metadata to event creator component 432 that can provide appropriate metadata to content generation component 426 to reproducibly generate output data that can be employed by event creator component 432 to generate test events that can be provided, e.g., as writes, to an OES storage system under test, e.g., via processor component 404. It is noted that first metadata, e.g., an OES name, can be passed to content generator component 426 to determine the N writers, for example illustrated at 6002 of FIG. 6, and second metadata, e.g., the names of the N writers can be again passed into content generator component 426 to determine the data to be parsed, for example in to blocks of S-8 bytes, that can populate M events. As such, input to, and output from, content generation component 426 with event creator component 432 can result in generating events that support an N×M array of events, e.g., N unique writer instances that can each write M events of size S. As noted elsewhere herein, embodiments that generate N rows of events each with other counts of events, e.g., not all rows have M events, are also within the scope of the disclosed subject matter but are not discussed in detail only for the sake of clarity and brevity. Event creator component 432 can further pass the determined metadata to metadata storage component 424 that can facilitate storage of the metadata to support later verification of the stored test event data. Accordingly, DVC 420 can enable writing of test events into a OES storage system based on OES metadata that can be retained to enable reproducible regeneration of test data to support data verification testing.

Figure 5:
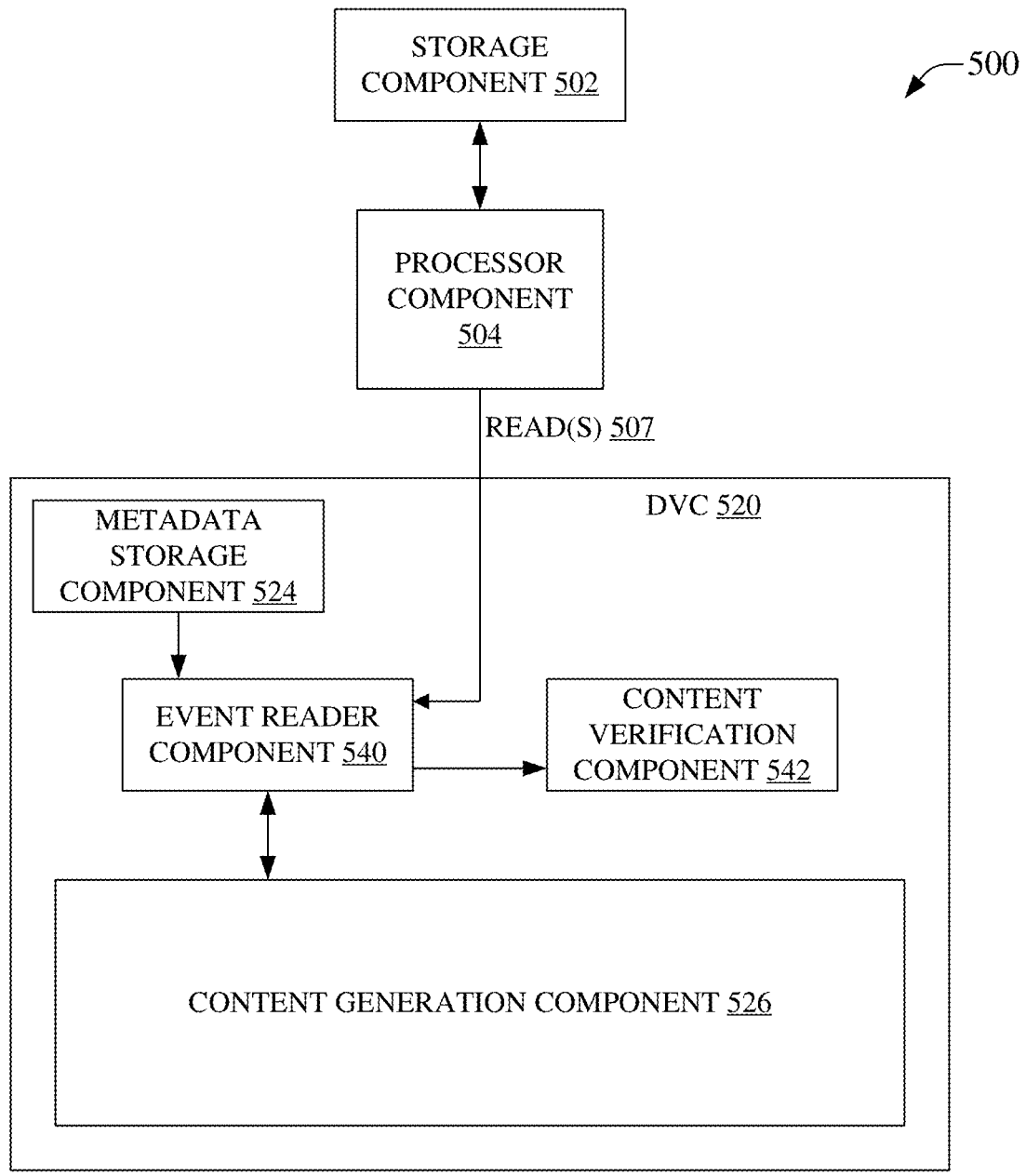
FIG. 5 is an illustration of an example system that can facilitate reading test data from an ordered event stream storage system, wherein the test data supports verification of the test data stored via the ordered event stream storage system, in accordance with aspects of the subject disclosure.

FIG. 5 is an illustration of an example system 500, which can enable reading test data from an ordered event stream storage system, wherein the test data supports verification of the test data stored via the ordered event stream storage system, in accordance with aspects of the subject disclosure. System 500 can comprise storage component 502 that can store an OES that can store one or more events according to a routing key that can be determined from aspects of the event. Events can be written to an OES in an ordered manner, for example, via write(s) 106, 206, 306, 406, etc., which can enable writing of test data as test events into an OES stored via storage elements comprised in at least storage component 502. Events, including test events, can be read from the OES in an ordered manner, e.g., as read(s) 507. In an aspect, keys of one or more segments of an OES can represent a key space. Segments can therefore act as logical containers associated with a particular range of keys for an event stream and can be used to store events, including test events, within an OES. Ordered event stream system 500 can comprise segments. In an aspect, system 500 can store events, again including test events, according to segments, for example, as illustrated at 230 of FIG. 2. In an example, storage component 502 can comprise new storage space that is to be endurance tested. In this example, reads(s) 507 can read test events from a test OES storing events via the new storage space. In this manner, the example test data can be read from the new storage space to support verifying the endurance/performance of the new storage space. In this example, processor component 504 can support typical OES read operations that navigate the events stored via at least storage component 502, e.g., sequentially reading events, including test events, from storage in a manner that addresses bridging disparately located portions of storage for an OES, including a test OES. As such, DVC 520, in this embodiment, need not be burdened with management of the OES event storage other than to request that events of a test OES be read out to DVC 520, components of DVC 520, or other corresponding unillustrated components.

DVC 520 can facilitate verification of test data, and, in the illustrated example embodiment, can be attached to a typical ordered event stream storage system, illustrated as embodying processor component 504, storage component 502, and read(s) 507. DVC 520 can support data verification of test events stored in an OES storage system, for example, a typical OES storage system embodied in processor component 504, storage component 502, write(s) 506, and read(s) 507. Metadata corresponding to the OS storage system under test can be retrieved via metadata storage component 524, e.g., from local and/or remote metadata storage. The retrieved metadata can be communicated to event reader component 540. Event reader component 540 can pass the metadata to content generation component 526, that can regenerate test event data, e.g., regenerating an N×M array of test event data based on inputting metadata to reproducibly generate test event data via one or more applications of a QRRSB function(s), which can replicate the previous generation of event data written to the OES storage system under test. Further, event reader component 540 can act as a reader application to request processor component 504 read events from the OES system under test, e.g., as read(s) 507. Content verification component 540 can determine verification of test event data based on the reproduced event data and on the data read from events via read(s) 507. Where a read and regenerated data match, the stored test data can be verified. Where it does not match, the stored data can fail verification. Accordingly, a warning can be generated and communicated to operators, etc., corrective actions can be triggered, deeper analysis can be initiated, access to parts or all of the OES storage system under test can be restricted, etc.

In typical OES testing embodiments, the data written into test events can include sequencing information, e.g., previously disclosed as the first 8 bytes of event data storing sequence information. Sequence information can indicate an identification of a corresponding writer of the N parallel writers, which can result in passing the verification to a properly corresponding writer in verification mode of the disclosed test tool, e.g., where each of the N writers has a unique key, data should be regenerated by a writer using the same unique key in both the writing and the verification modes. In an example, a first 4 bytes of data stored in a test event can be writer sequencing information. Moreover, other sequencing information can reflect the order of the event being written by a particular writer of the N writers. As an example, a second 4 bytes of the data stored in a test event can be compared to a sequence information for the preceding tested event to determine that the current event in testing is properly the 'next' test event of that particular writer of the N writers for the tested OES storage system. This can result in the remaining 'S-8' bytes of the test event being populated with a corresponding portion of the stream of data generated based on that particular writer key. In this regard, the disclosed subject matter can test that the event is in the correct order and can further test that the remaining S-8 portion of read data matches the S-8 portion of regenerated data for that writer of the N writers. These benefits further support OES scaling in that the content of the events is unrelated to the scaling of the OES under test, e.g., the event data will be the same in a scaled and in an unscaled OES created from the same metadata and QRRSB function(s).

FIG. 6 is an illustration of a system 600 that can facilitate verification of test data stored via an ordered event stream storage system based on OES metadata, in accordance with aspects of the subject disclosure. System 600 can comprise storage component 602 that can store an OES that can store one or more events according to a routing key that can be determined from aspects of the event. Events can be written to an OES in an ordered manner, e.g., via write(s) 606, and can be read from the OES in an ordered manner, e.g., via read(s) 607. In an aspect, keys of one or more segments of an OES can represent a key space. Segments can therefore act as logical containers associated with a particular range of keys for an event stream and can be used to store events within an OES. Ordered event stream system 600 can comprise segments. In an aspect, system 600 can store events according to segments, for example, as illustrated at 230 of FIG. 2. DVC 620 can facilitate writing of test events to an OES storing data on storage component 602. Similarly, DVC 620 can facilitate reading and verification of test events from the OES storing data on storage component 602.

DVC 620 can generate and regenerate an N×M matrix of events based on OES metadata. Generated events of the N×M matrix of events can be stored via an OES storage system as test events. The event data of the N×M matrix generated by DVC 620 can be stored via typical OES operations, e.g., the event data, e.g., data of E(1,1) to E(N,M), etc., can be presented as write(s) 606 to processor component 604 that can store the event data as OES events via storage component 602. As such, an OES storage system does not need to be modified to use the data verification test tool enabled via DVC 620, rather, in embodiments, DVC 620 can be connected to an already deployed OES storage system and can begin testing that already deployed system.

DVC 620 can determine OES metadata, e.g., via metadata generator component 330, 430, etc., which can be based on user input, such as can be received via UI 322, etc., on OES characteristics, e.g., an OES 'name' that can, for example, indicate a head of an OES, etc., a measure of parallelism, e.g., a number of parallel event writers 'N' for the test OES, a count of events to write 'M' via the parallel writers during the test, a size 'S' of events, and which QRRSB function(s) are employed. The OES name, e.g., stream name 6000, etc., can be passed into a QRRSB function and can reproducibly generate first data that can be parsed into unique keys for writers that can generate rows of events in the N×M event matrix, e.g., the first data can comprise RK(1) to RK(N) at 6002, and RK(1) to RK(N) can be reproducibly ascertained. As an example, if QRRSB(Stream Name)→pi, and the parsing of pi is in units of 256 bytes, then RK(1) can be 3.1415926535897932384626433832795028 . . . out to the $256^{th}$ byte, RK(2) can be from the $257^{th}$ byte to the $512^{th}$ byte, RK(3) can be from the $513^{th}$ byte to the $756^{th}$ byte, . . . , RK(N) can be from the [(256)(N)] byte to the [(256)*(N+1)] byte, etc. this can result in N writers that can represent the maximum parallelism allowed in the testing of an OES storage system, e.g., a maximum number of parallel writers. These writers can be directed to each generate 'M' events for ingestion via write(s) 606 in to the OES storage system via processor component 602.

In the illustrated embodiment, DVC 620 can generate data for storage in each of events E(1,1) to E(1,M) based on passing the value of RK(1) into a QRRSB function, which can result in a populating M columns, 6004, of the RK(1) row of the N×M event matrix, e.g., at 60021. Similarly, events of 60022 can result from inputting RK(2) into a QRRSB function, events of 60023 can result from ingesting RK(3) into a QRRSB function, etc. It is noted that the events, e.g., 6008, etc., can be of size 'S' as illustrate at 6006. This illustrates that events E(1,1) to E(N,M) can be generated based on OES metadata that can comprise a stream name, N, M, S, and any employed QRRSB function(s). It is noted that the QRRSB function employed at 6002 can be the same or different than the QRRSB function used at 60021, which can also be the same or different than the QRRSB function used at 60022, 60023, etc. As such, the same QRRSB function can be reused, throughout the N×M matrix, e.g., 6002, 60021, 60022, 60023, can all use a same QRRSB function, or one or more of those QRRSB function(s) can be different than the other QRRSB function(s). The use of the same QRRSB function is possible because the input to the QRRSB function can be different at each use, e.g., the input can firstly be stream name 6000, which can yield a first string of data that can be parsed to give RK(1) to RK(N) values that can then be passed into a same QRRSB function to generate a second string of data that can be used to populate the M events of size S in 60021, a third string of data for the events of 60022, ..., a Nth string of data for the events of 60023, etc. However, more than one QRRSB function can also be employed without departing form the scope of the presently disclosed subject matter. In some instances, a QRRSB function can store the string of data in a ring buffer or other pool to enable increased testing speeds. It is additionally noted that the data stored in the test events can be partially substituted with sequence information to enable order testing as is disclosed at length elsewhere herein, e.g., the events can store 4 bytes of writer sequence data, 4 bytes of event sequence data for a specific writer, and S-8 bytes of data from the QRRSB function seeded with the corresponding stream writer name, e.g., RK(1) to RK(N), etc.

Similarly, the OES metadata can be also used to regenerate the N×M events. This can be in the same manner as generating the N×M matrix for storage via the OES storage system under test. Accordingly, DVC 620 can read the stored test events via processor component 604, e.g., as read(s) 607, and can compare the read events to regenerated events to facilitate event and/or event order verification. Verification failure can trigger, or be used to initiate, a selectable response, e.g., flagging the verification failure, sending warnings pertaining to the verification failure, marking the storage element of storage component 602 associated with the verification error as unusable, triggering a mitigation or repair function, etc. It is again noted that scaling of the writing of test events and/or reading of test events for verification does not affect the content of the events themselves, rather only affecting the logical and/or physical storage of the events, and as the verification test verifies the content of the event, OES scaling is perfectly acceptable and, often, even desirable to provide a more real-world test of the OES storage system. In some embodiments, the OES can be scaled by altering a rate at which the events of the N×M matrix are presented as write(s) 606 or requested as read(s) 608 to/from processor component 604. The OES storage system under test can function in a typical manner and can scale up/down in response to an increasing/decreasing demand on processor component 604 that can correspond to the rate at which the events of the N×M matrix are presented by DVC 620. As such, an OES storage system to be tested does not need to be modified to be subjected to verification testing according to the presently disclosed subject matter, e.g., DVC 620 can be connected to nearly any deployed OES storage system and operate as presently disclosed.

Figure 7:
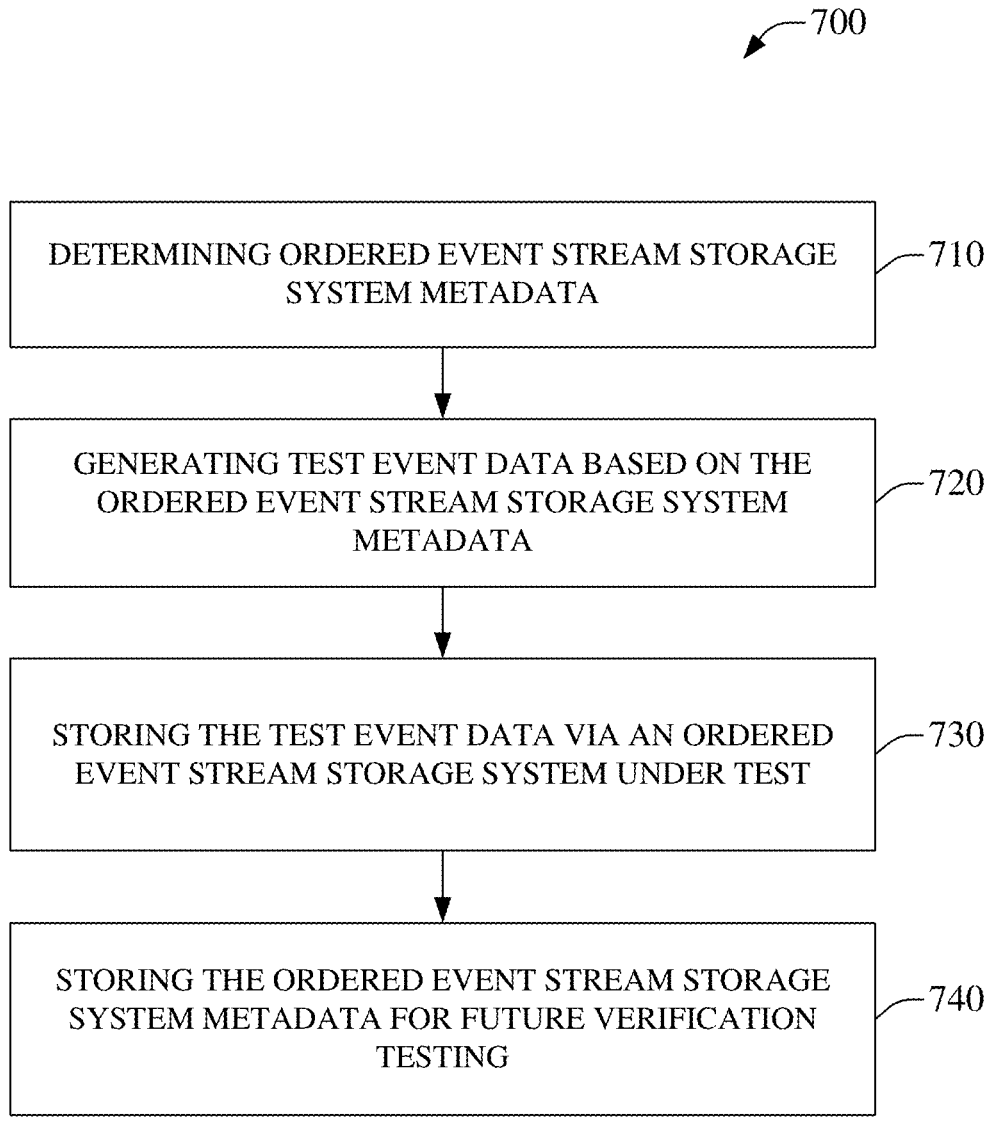
FIG. 7 is an illustration of an example method facilitating writing test data to an ordered event stream storage system, wherein the test data supports verification of the test data stored via the ordered event stream storage system, in accordance with aspects of the subject disclosure.
Figure 8:
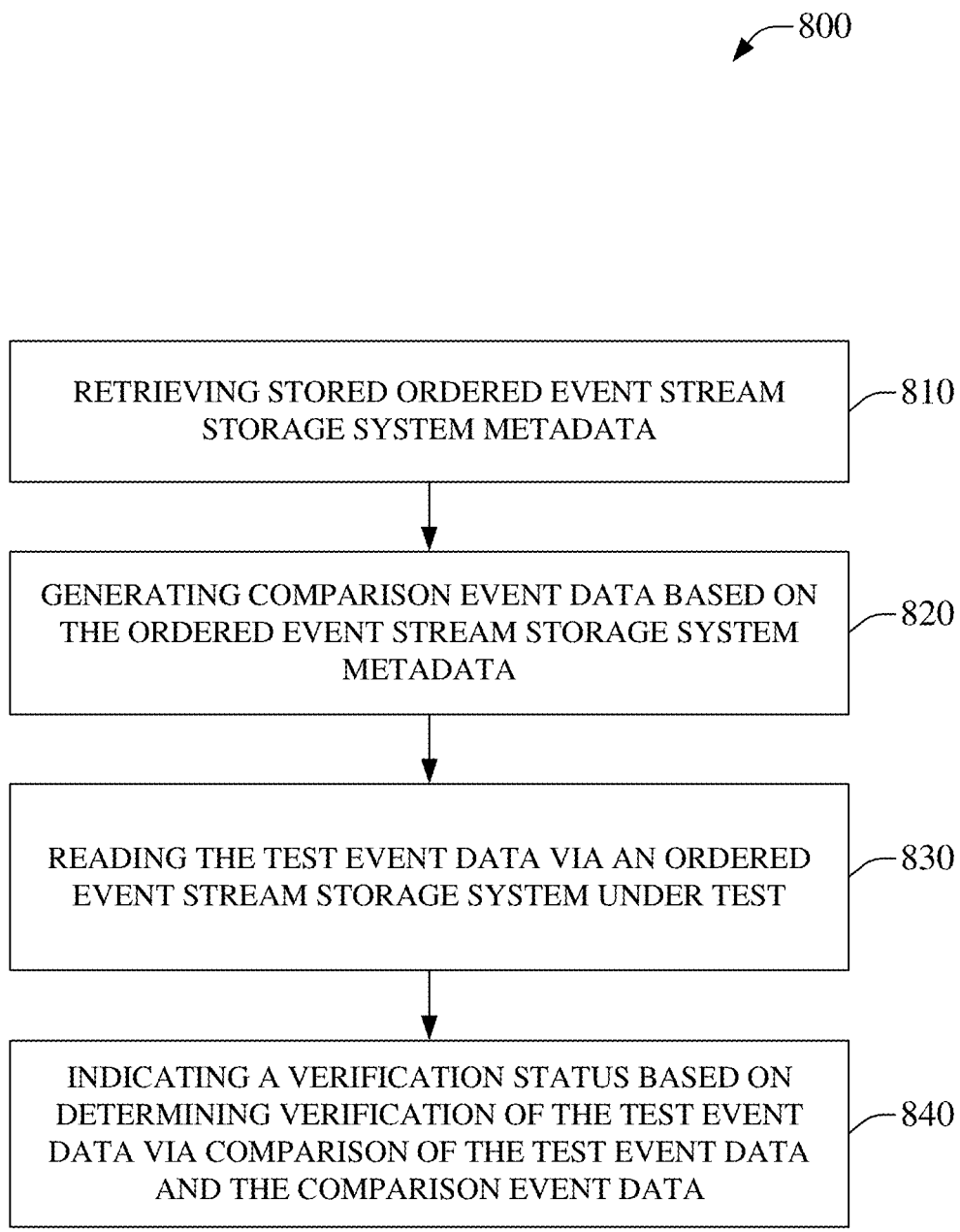
FIG. 8 is an illustration of an example method facilitating reading test data from an ordered event stream storage system, wherein the test data supports verification of the test data stored via the ordered event stream storage system, in accordance with aspects of the subject disclosure.

In view of the example system(s) described above, example method(s) that can be implemented in accordance with the disclosed subject matter can be better appreciated with reference to flowcharts in FIG. 7-FIG. 8. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternately be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

FIG. 7 is an illustration of an example method 700 that can facilitate writing test data to an ordered event stream storage system, wherein the test data supports verification of the test data stored via the ordered event stream storage system, in accordance with aspects of the subject disclosure. At 710, method 700 can comprise determining ordered event stream storage system metadata. OES storage system metadata can comprise a stream name (Name') as a string, a level of parallelism within the stream ('N') as a long; an event size ('S') as a long; a number of events per writer ('M') as a long, one or more QRRSB function(s), etc. OES storage system metadata can be determined form input received via a UI, e.g., UI 322, etc., via parameters of an OES storage system, e.g., 100, 200, etc., or from other sources. In some embodiments, some values can be default values, for example, N, M, and S defaults can be 1, 10,000, and 1 MB, correspondingly. In some embodiments, some default values can be mixed with non-default values, for example, the stream name can be provided via a UI, N can default to 1, S can default to 5 GB, and M can be determined based on the OES storage system test storage size 'KS' such that M=KS/S, e.g., the storage area to be tested can be divided by the size of the events to be stored to determine a number of events to write. Similarly, S=KS/(M*N), wherein a designated number of events to write per unique writer can determine a size of each event. Numerous other examples of determining the metadata for the OES storage system to be tested are readily appreciated and are to be considered within the scope of the instant disclosure even where not exhaustively recited for the sake of clarity and brevity.

At 720, method 700 can comprise generating test event data based on the ordered event stream storage system metadata. Test data is reproducibly generated, e.g., for the same input metadata, the same output data will be generated. In embodiments, a QRRSB function(s) can return a data sequence that is reproducible based on a reproducible input, e.g., a key, wherein passing in the same key to the function(s) will return the same data sequence every time. Events of an N×M test event matrix can be generated at 720, for example, by passing in an OES Name value to generate a first string of data that can be parsed into N unique keys that can correspond to N parallel test event writers, e.g., to facilitate writing events for N parallel rows of M events. Each of the N unique row keys can be passed in to next generate a second string of data that can be parsed into M events, for example, M events of size S where the S amount of data is taken sequentially from the second string, M events of size S where S-8 amount of data is taken sequentially from the second string and the remain 8 units of data is inserted determined sequence data as disclosed elsewhere herein, etc. The generated test data based on the OES metadata can readily be reproduced from the metadata and employed QRRSB function(s) at any time. As such, further validation of any stored data can be in reference to reproduced test data based on the OES metadata.

Method 700, at 730, can comprise storing the test event data via an ordered event stream storage system under test. The generated test event data can be passed to an OES storage system under test for storage. In this regard, embodiments of the data verification tool technology disclosed herein can be connected to nearly any existing OES storage system without modification of the OES storage system, e.g., the OES storage system can treat the incoming test event data the same as it would treat any other customer data. This equal treatment can include scaling of the OES, for example, based on an ingestion rate of test event data into the OES storage system under test. This can enable the test events to be provided in a manner that can limit or promote scaling of an unmodified OES storage system under test, which can provide excellent real-world testing of storage systems. As such, method 700 can cause storing of the test event data by providing the test event data generated at 720 to an OES storage system under test at 730, whereby the actual storage is performed by the OES storage system via typical OES storage system operations. In this regard, it is noted that the content of the stored events is consistent despite any scaling or other management that may occur via typical OES operations, which can enable verification of the stored data at a later time.

At 740, method 700 can comprise storing the ordered event stream storage system metadata for future verification testing. At this point method 700 can end. As is noted elsewhere herein, the strings of data generated for event testing are reproducible where they result from a same input, e.g., passing a first value into a function at time zero can result in a first output and passing the first value into the function at a much later time will then again result in the first output. As such, the OES storage system metadata determined at 710 can be stored at 740 to facilitate future regeneration of event data in a data verification mode. Typically, the metadata can be stored during pendency of a verification test, e.g., the metadata is stored until the test event data is later verification tested. In some embodiment, the metadata can be stored longer, for example, where a first verification is performed at 24 hours, a second verification is performed at 7 day, a third verification is performed at 3 months, etc., the metadata can be stored until all verifications of the originally stored data have been performed.

FIG. 8 is an illustration of an example method 800, which can enable reading test data from an ordered event stream storage system, wherein the test data supports verification of the test data stored via the ordered event stream storage system, in accordance with aspects of the subject disclosure. At 810, method 800 can comprise retrieving stored ordered event stream storage system metadata. As noted at 740 of method 700, metadata can be stored to facilitate operations of the disclosed data verification technology in a verification mode. As such, the stored OES storage system metadata can be retrieved from metadata storage.

Method 800 can further comprise, at 820, generating comparison event data based on the ordered event stream storage system metadata. In a manner that is the same as, or similar to, generating the test event data, the retrieved metadata can be employed to regenerate the test event data. As has been noted, for a same input, a function can reproducibly generate a same output, as such, passing in the metadata to the function used to generate the stored test event data will again generate, or rather regenerate, the test event data, which can be regard as comparison test data. This regenerated data can be employed in data verification analysis.

At 830, method 800 can comprise reading the test event data via an ordered event stream storage system under test. Previously written test event data can be read from an OES storage system under test, e.g., test event data written at 730 of method 700, for example. The read data can have been stored for a period of time and, as such, can have been subject to potential data corruption, e.g., loss of some portion of stored data, bit flipping at parts of stored data, intentional or unintentional overwriting of stored data, transmission errors of stored data, etc. Determining an occurrence of corruption can be based on comparing the stored data when written to the stored data when later read. However, conventional techniques would then require perfectly storing a replica, e.g., the corruption of the replica can cause the verification to fail, etc., to test the stored data, which can consume large amount of storage space, e.g., to verify X amount of stored data would then require at least 2×stored data, so where X is large, this inefficiency can be prohibitive. In the alternate, checksums can be computed and stored. Again, the checksums are not highly storage space efficient. However, more problematic is that the checksums are typically not one-to-one unique, e.g., a same checksum can be generated from different inputs. This can lead to imperfect verification testing because the stored data may, in some instances, generate a same checksum even where it was actually corrupted. In contrast, the presently disclosed subject can perfectly reproduce, e.g., regenerate, the test event data based on the stored OES metadata retrieved at 810. As such, the stored data can be directly compared, e.g., bit by bit, etc., to the regenerated data to verify that the storage of the data was without corruption. Additionally, an order of the stored test events can also be verified, as disclosed elsewhere herein, based on sequence information that can be stored in the test event data. It is noted that corruption of stored test event sequence information can cause a sequencing fault that can also be considered corruption of the stored data. Moreover, even where sequence data is not corrupted, e.g., a proper event order is verified, corruption of other portions of the stored test event data can still indicate a verification failure via the comparison to regenerated test event data.

At 840, method 800 can comprise indicating a verification status based on determining verification of the test event data via comparison of the test event data and the comparison event data. At this point, method 800 can end. Where verification of a stored test event fails, which can include an event order verification failure, the failure can be indicated. In some embodiments, the indication can cause use of the failed portion of the OES storage system under test to be restricted, e.g., if data stored in a portion of an OES storage system becomes corrupted, then detection of that corrupt can be employed to prevent storage of data at that portion of the OES to be restricted in an attempt to limit potential data loss events from occurring. The indication of the verification status can also trigger mitigation operations, additional analysis operations, repair operations, or just causing a UI to signal the verification status such that an operator can make further decisions.

Figure 9:
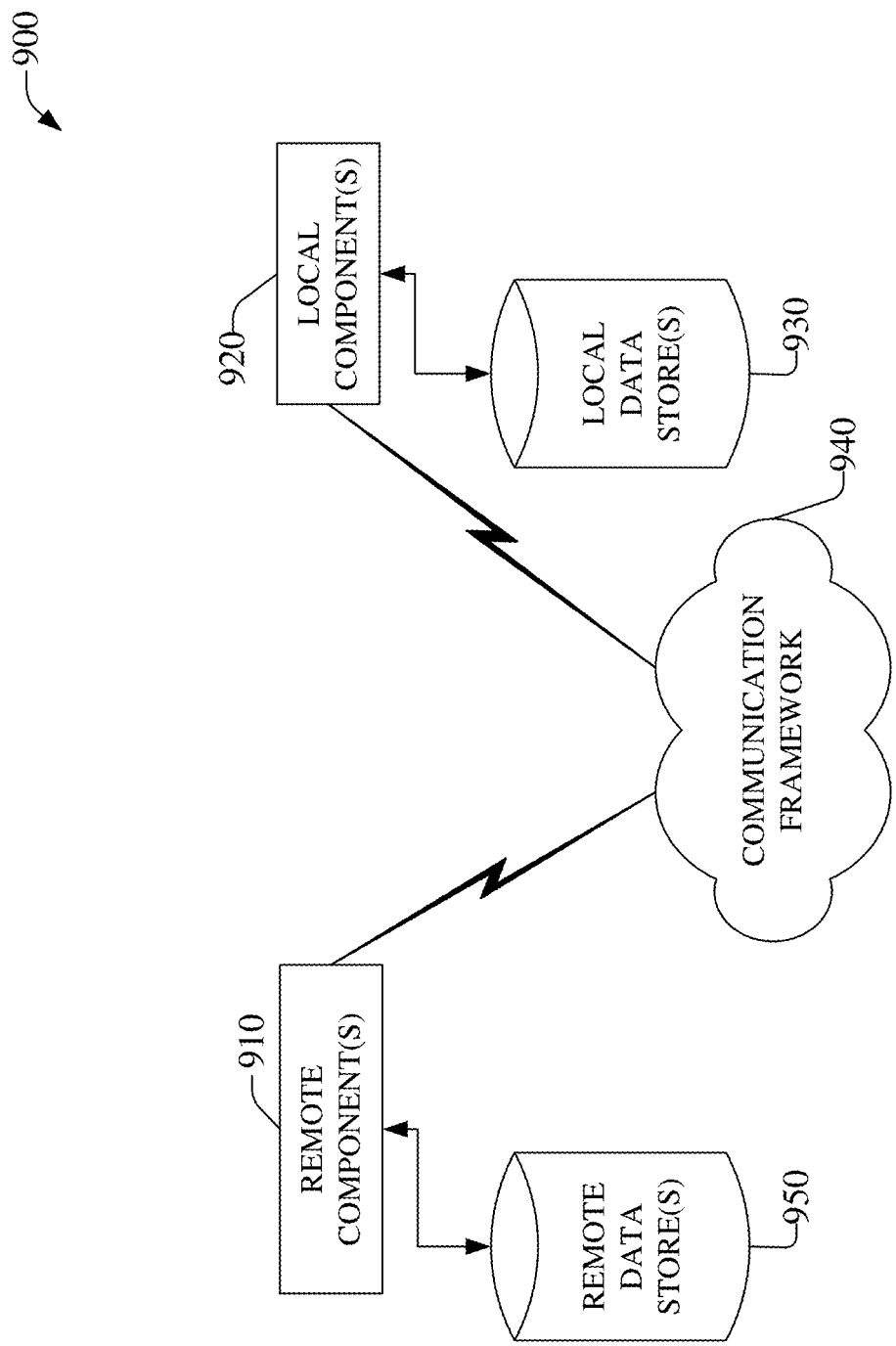
FIG. 9 depicts an example schematic block diagram of a computing environment with which the disclosed subject matter can interact.

FIG. 9 is a schematic block diagram of a computing environment 900 with which the disclosed subject matter can interact. The system 900 comprises one or more remote component(s) 910. The remote component(s) 910 can be hardware and/or software (e.g., threads, processes, computing devices). In some embodiments, remote component(s) 910 can be a remotely located device comprised in storage component 102-602, etc., a remotely located processor device comprised in processor component 104-604, etc., a remotely located device comprised in data verification component 120-620, etc., or other remotely located devices, which can be connected to a local component via communication framework 940. Communication framework 940 can comprise wired network devices, wireless network devices, mobile devices, wearable devices, radio access network devices, gateway devices, femtocell devices, servers, etc.

The system 900 also comprises one or more local component(s) 920. The local component(s) 920 can be hardware and/or software (e.g., threads, processes, computing devices). In some embodiments, local component(s) 920 can comprise a local device comprised in storage component 102-602, etc., a locally located processor device comprised in processor component 104-604, etc., a locally located device comprised in data verification component 120-620, etc., or other locally located devices.

One possible communication between a remote component(s) 910 and a local component(s) 920 can be in the form of a data packet adapted to be transmitted between two or more computer processes. Another possible communication between a remote component(s) 910 and a local component(s) 920 can be in the form of circuit-switched data adapted to be transmitted between two or more computer processes in radio time slots. The system 900 comprises a communication framework 940 that can be employed to facilitate communications between the remote component(s) 910 and the local component(s) 920, and can comprise an air interface, e.g., Uu interface of a UMTS network, via a long-term evolution (LTE) network, etc. Remote component(s) 910 can be operably connected to one or more remote data store(s) 950, such as a hard drive, solid state drive, SIM card, device memory, etc., that can be employed to store information on the remote component(s) 910 side of communication framework 940. Similarly, local component(s) 920 can be operably connected to one or more local data store(s) 930, that can be employed to store information on the local component(s) 920 side of communication framework 940. As examples, writing, reading, erasing, expiring, caching, framing, annulling, verifying stored data, verifying an order, etc., of events of segments of an OES(s) in systems 100-600, etc., can be communicated via communication framework 940 among storage components of an OES storage network 100-600, etc., e.g., to facilitate adapting, altering, modifying, erasing, deleting, freeing, caching, framing, annulling, etc., events, and/or verifying stored test data, verifying an order of stored test events, etc., stored via one or more OES(s), as disclosed herein.

Figure 10:
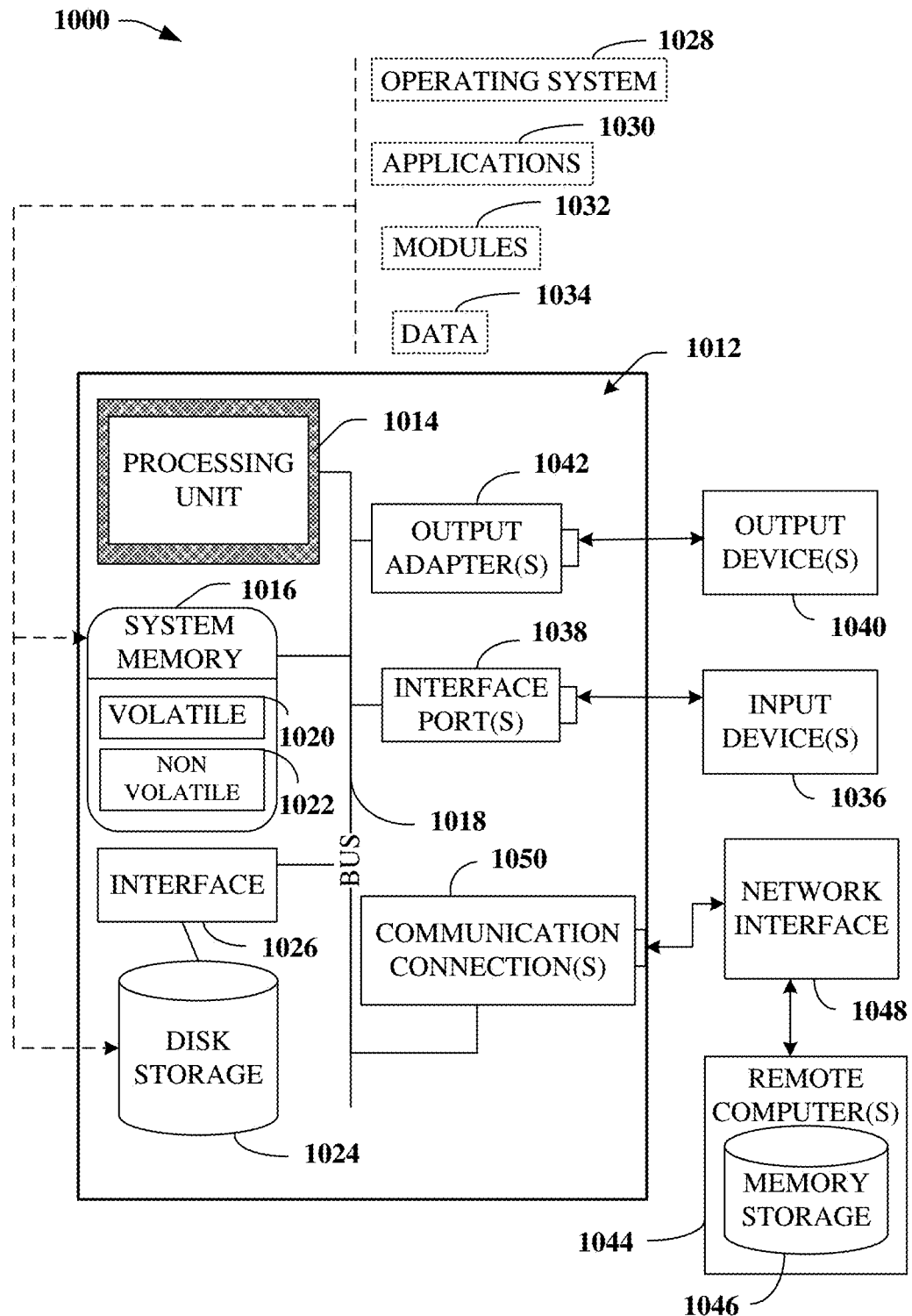
FIG. 10 illustrates an example block diagram of a computing system operable to execute the disclosed systems and methods in accordance with an embodiment.

In order to provide a context for the various aspects of the disclosed subject matter, FIG. 10, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that performs particular tasks and/or implement particular abstract data types.

In the subject specification, terms such as "store," "storage," "data store," data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can comprise both volatile and nonvolatile memory, by way of illustration, and not limitation, volatile memory 1020 (see below), nonvolatile memory 1022 (see below), disk storage 1024 (see below), and memory storage 1046 (see below). Further, nonvolatile memory can be included in read only memory, programmable read only memory, electrically programmable read only memory, electrically erasable read only memory, or flash memory. Volatile memory can comprise random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, SynchLink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, comprising single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 10 illustrates a block diagram of a computing system 1000 operable to execute the disclosed systems and methods in accordance with an embodiment. Computer 1012, which can be, for example, comprised in any of storage component 102-602, processor component 104-604, DVC 120-620, etc., can comprise a processing unit 1014, a system memory 1016, and a system bus 1018. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture, microchannel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1194), and small computer systems interface.

System memory 1016 can comprise volatile memory 1020 and nonvolatile memory 1022. A basic input/output system, containing routines to transfer information between elements within computer 1012, such as during start-up, can be stored in nonvolatile memory 1022. By way of illustration, and not limitation, nonvolatile memory 1022 can comprise read only memory, programmable read only memory, electrically programmable read only memory, electrically erasable read only memory, or flash memory. Volatile memory 1020 comprises read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, SynchLink dynamic read only memory, Rambus direct read only memory, direct Rambus dynamic read only memory, and Rambus dynamic read only memory.

Computer 1012 can also comprise removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, flash memory card, or memory stick. In addition, disk storage 1024 can comprise storage media separately or in combination with other storage media comprising, but not limited to, an optical disk drive such as a compact disk read only memory device, compact disk recordable drive, compact disk rewritable drive or a digital versatile disk read only memory. To facilitate connection of the disk storage devices 1024 to system bus 1018, a removable or non-removable interface is typically used, such as interface 1026.

Computing devices typically comprise a variety of media, which can comprise computer-readable storage media or communications media, which two terms are used herein differently from one another as follows. Machine-readable storage media, which can include any computer-readable storage media, can be any available storage media that can be accessed by the machine or computer and can comprise both volatile and nonvolatile media, and removable and non-removable media. By way of example, and not limitation, machine-readable storage media can be implemented in connection with any method or technology for storage of information such as computer-readable instructions, program modules, structured data, or unstructured data. Machine-readable storage media can comprise, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not exclusively propagating intangible signals per se. In an aspect, tangible media can comprise non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not exclusively propagating transitory signals per se. Machine-readable storage media can be accessed by one or more local or remote computing devices, e.g., via access requests, queries or other data retrieval protocols, for a variety of operations with respect to the information stored by the medium. As such, for example, a machine-readable medium can comprise executable instructions stored thereon that, in response to execution, can cause a system comprising a processor to perform operations comprising populating test events for an OES with content reproducibly determined, at least in part, from metadata corresponding to an OES storage system to be tested. The content can comprise sequence information. The operations can further comprise causing the OES storage system to write the test events, such that the storage of the test events facilitates data verification of the content at a future time. At the future time, the operations can further comprise regenerating the content as regenerated content based on the metadata and causing the content to be read from the ordered event stream storage system. The operations can further comprise verifying an order of the read content based on the sequence information and verifying the content based on comparing the content and the regenerated content.

Communications media typically embody machine-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

It can be noted that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be noted that the disclosed subject matter can be implemented with various operating systems or combinations of operating systems.

A user can enter commands or information into computer 1012 through input device(s) 1036. In some embodiments, a user interface can allow entry of user preference information, etc., and can be embodied in a touch sensitive display panel, a mouse/pointer input to a graphical user interface (GUI), a command line controlled interface, etc., allowing a user to interact with computer 1012. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1014 through system bus 1018 by way of interface port(s) 1038. Interface port(s) 1038 comprise, for example, a serial port, a parallel port, a game port, a universal serial bus, an infrared port, a Bluetooth port, an IP port, or a logical port associated with a wireless service, etc. Output device(s) 1040 use some of the same type of ports as input device(s) 1036. Thus, for example, a universal serial bus port can be used to provide input to computer 1012 and to output information from computer 1012 to an output device 1040. Output adapter 1042 is provided to illustrate that there are some output devices 1040 like monitors, speakers, and printers, among other output devices 1040, which use special adapters. Output adapters 1042 comprise, by way of illustration and not limitation, video and sound cards that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, cloud storage, a cloud service, code executing in a cloud-computing environment, a workstation, a microprocessor-based appliance, a peer device, or other common network node and the like, and typically comprises many or all of the elements described relative to computer 1012. A cloud computing environment, the cloud, or other similar terms can refer to computing that can share processing resources and data to one or more computer and/or other device(s) on an as needed basis to enable access to a shared pool of configurable computing resources that can be provisioned and released readily. Cloud computing and storage solutions can store and/or process data in third-party data centers which can leverage an economy of scale and can view accessing computing resources via a cloud service in a manner similar to a subscribing to an electric utility to access electrical energy, a telephone utility to access telephonic services, etc.

For purposes of brevity, only a memory storage device 1046 is illustrated with remote computer(s) 1044. Remote computer(s) 1044 is logically connected to computer 1012 through a network interface 1048 and then physically connected by way of communication connection 1050. Network interface 1048 encompasses wire and/or wireless communication networks such as local area networks and wide area networks. Local area network technologies comprise fiber distributed data interface, copper distributed data interface, Ethernet, Token Ring and the like. Wide area network technologies comprise, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and digital subscriber line modems, integrated services digital network adapters, and Ethernet cards.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. Moreover, the use of any particular embodiment or example in the present disclosure should not be treated as exclusive of any other particular embodiment or example, unless expressly indicated as such, e.g., a first embodiment that has aspect A and a second embodiment that has aspect B does not preclude a third embodiment that has aspect A and aspect B. The use of granular examples and embodiments is intended to simplify understanding of certain features, aspects, etc., of the disclosed subject matter and is not intended to limit the disclosure to said granular instances of the disclosed subject matter or to illustrate that combinations of embodiments of the disclosed subject matter were not contemplated at the time of actual or constructive reduction to practice.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities, machine learning components, or automated components (e.g., supported through artificial intelligence, as through a capacity to make inferences based on complex mathematical formalisms), that can provide simulated vision, sound recognition and so forth.

Aspects, features, or advantages of the subject matter can be exploited in substantially any, or any, wired, broadcast, wireless telecommunication, radio technology or network, or combinations thereof. Non-limiting examples of such technologies or networks comprise broadcast technologies (e.g., sub-Hertz, extremely low frequency, very low frequency, low frequency, medium frequency, high frequency, very high frequency, ultra-high frequency, super-high frequency, extremely high frequency, terahertz broadcasts, etc.); Ethernet; X.25; powerline-type networking, e.g., Powerline audio video Ethernet, etc.; femtocell technology; Wi-Fi; worldwide interoperability for microwave access; enhanced general packet radio service; second generation partnership project (2G or 2GPP); third generation partnership project (3G or 3GPP); fourth generation partnership project (4G or 4GPP); long term evolution (LTE); fifth generation partnership project (5G or 5GPP); third generation partnership project universal mobile telecommunications system; third generation partnership project 2; ultra mobile broadband; high speed packet access; high speed downlink packet access; high speed uplink packet access; enhanced data rates for global system for mobile communication evolution radio access network; universal mobile telecommunications system terrestrial radio access network; or long term evolution advanced. As an example, a millimeter wave broadcast technology can employ electromagnetic waves in the frequency spectrum from about 30 GHz to about 300 GHz. These millimeter waves can be generally situated between microwaves (from about 1 GHz to about 30 GHz) and infrared (IR) waves, and are sometimes referred to extremely high frequency (EHF). The wavelength ($\lambda$) for millimeter waves is typically in the 1-mm to 10-mm range.

The term "infer" or "inference" can generally refer to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference, for example, can be employed to identify a specific context or action, or can generate a probability distribution over states of interest based on a consideration of data and events. Inference can also refer to techniques employed for composing higher-level events from a set of events and/or data. Such inference results in the construction of new events or actions from a set of observed events and/or stored event data, whether the events, in some instances, can be correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
a processor; and
a memory that stores executable instructions that, when executed by the processor, facilitate performance of operations, comprising:
determining metadata for an ordered event stream storage system, wherein the metadata comprises an ordered event stream identifier, an indicator of ordered event writing parallelism, and a count of test events to be generated;
generating content for storage via test events, wherein the generating is based, at least in part, on the metadata;
writing test events comprising the content to the ordered event stream storage system; and
storing the metadata to facilitate a future verification of the content stored via the test events.

2. The system of claim 1, wherein the generating the content based on the metadata comprises reproducibly generating the content.

3. The system of claim 2, wherein passing a portion of the metadata into a quasi-random reproducible sequence of bytes function reproducibly generates the content.

4. The system of claim 1, wherein the operations further comprise storing the metadata to facilitate a later verification of the content stored via the ordered event stream storage system.

5. The system of claim 4, wherein the storing the metadata facilitates a future verification of the content stored via the ordered event stream storage system.

6. The system of claim 1, wherein the metadata further comprises a size of a test event to be generated.

7. The system of claim 1, wherein the ordered event stream storage system is not modified to facilitate data verification prior to performance of the operations, and wherein the writing the test events is performed using conventional ordered event stream operations.

8. The system of claim 1, wherein the writing the test events results in writing to an identified portion storage of the ordered event stream storage system, and wherein the identified portion storage is the target of data verification testing.

9. The system of claim 1, wherein the operations further comprise:
regenerating the content as regenerated content based on the metadata;
receiving the content from the ordered event stream storage system; and
verifying the content based on comparing the content and the regenerated content.

10. The system of claim 9, wherein the regenerated content is identical to the content previously generated for storage via the ordered event stream storage system.

11. The system of claim 9, wherein the metadata is retrieved from metadata storage.

12. The system of claim 9, wherein an order of events is verified based on a portion of the content comprising sequence information.

13. The system of claim 9, wherein the operations further comprise indicating a verification failure in response to a mismatch being determined to be present between the content and the regenerated content.

14. The system of claim 9, wherein the operations further comprise initiating a mitigation response in response to a mismatch being determined to be present between the content and the regenerated content.

15. A method, comprising:
generating, by a system comprising a processor, content for storage via test events of an ordered event stream, wherein the generating is based, at least in part, on metadata corresponding to an ordered event stream storage system to be tested, and wherein the content comprises an ordered event stream identifier, an indicator of ordered event writing parallelism, a count of test events to be generated, and sequence information; and
initiating, by the system, writing of the test events comprising the content into the ordered event stream storage system, wherein storage of the test events via the ordered event stream storage system facilitates a future data verification of the content.

16. The method of claim 15, further comprising:
regenerating, by the system at a future time, the content as regenerated content based on the metadata;
initiating, by the system at the future time, reading the content from the ordered event stream storage system; and
verifying, by the system at the future time, the content based on a result of comparing the content and the regenerated content.

17. The method of claim 15, wherein the verifying comprises verifying an order of the reading the content from the ordered event stream storage system, and wherein the verifying the order is based on the sequence information comprised in the content read from the ordered event stream storage system.

18. A non-transitory machine-readable medium, comprising executable instructions that, when executed by a processor, facilitate performance of operations, comprising:
populating test events for storage via an ordered event stream with content reproducibly determined, at least in part, from metadata corresponding to an ordered event stream storage system to be tested, wherein the content comprises sequence information, and wherein the metadata comprises an ordered event stream identifier, an indicator of ordered event writing parallelism, and a count of test events to be generated; and
causing the ordered event stream storage system to write the test events comprising the content into the ordered event stream storage system, wherein storage of the test events via the ordered event stream storage system facilitates a data verification of the content after the storage of the test events.

19. The non-transitory machine-readable medium of claim 18, the operations, after the storage of the test events, further comprising:
regenerating the content as regenerated content based on the metadata;
causing the content to be read from the ordered event stream storage system;
verifying an order of the read content based on the sequence information; and
verifying the content based on comparing the content and the regenerated content.

20. The non-transitory machine-readable medium of claim 18, wherein the operations further comprise storing the metadata to facilitate a later verification of the content stored via the ordered event stream storage system.

* * * * *